US009685567B2

(12) United States Patent
Huang et al.

(10) Patent No.: US 9,685,567 B2
(45) Date of Patent: Jun. 20, 2017

(54) NANOCOMPOSITE PHOTODETECTOR

(71) Applicant: NUtech Ventures, Lincoln, NE (US)

(72) Inventors: Jinsong Huang, Lincoln, NE (US); Fawen Guo, Lincoln, NE (US)

(73) Assignee: NUtech Ventures, Lincoln, NE (US)

( * ) Notice: Subject to any disclaimer, the term of this patent is extended or adjusted under 35 U.S.C. 154(b) by 325 days.

(21) Appl. No.: 13/946,975

(22) Filed: Jul. 19, 2013

(65) Prior Publication Data
US 2014/0054442 A1 Feb. 27, 2014

Related U.S. Application Data

(60) Provisional application No. 61/673,787, filed on Jul. 20, 2012.

(51) Int. Cl.
| H01L 31/02 | (2006.01) |
| H01L 51/42 | (2006.01) |
| B82Y 20/00 | (2011.01) |
| H01L 51/00 | (2006.01) |

(52) U.S. Cl.
CPC ............ *H01L 31/02* (2013.01); *H01L 51/426* (2013.01); *H01L 51/4273* (2013.01); *B82Y 20/00* (2013.01); *H01L 51/0036* (2013.01); *H01L 51/0094* (2013.01); *H01L 2251/303* (2013.01); *Y02E 10/549* (2013.01)

(58) Field of Classification Search
CPC ..... H01L 31/022475; H01L 31/022483; H01L 31/0392; H01L 31/02; B82Y 20/00
USPC ............ 250/200; 252/514, 512; 257/21, 40, 257/184; 977/773
See application file for complete search history.

(56) References Cited

U.S. PATENT DOCUMENTS

| 7,270,871 B2* | 9/2007 | Jiang et al. ................. 428/304.4 |
| 2010/0127247 A1* | 5/2010 | Yang et al. ...................... 257/40 |
| 2011/0186830 A1* | 8/2011 | Burroughes et al. ........... 257/40 |
| 2012/0118368 A1* | 5/2012 | Huang et al. ................. 136/256 |
| 2012/0132898 A1* | 5/2012 | Pan et al. ......................... 257/40 |
| 2013/0153866 A1* | 6/2013 | Chen et al. ....................... 257/40 |
| 2013/0161596 A1* | 6/2013 | Huang et al. .................... 257/40 |
| 2014/0263945 A1* | 9/2014 | Huang et al. ................. 250/200 |

OTHER PUBLICATIONS

Yizheng Jin et al., "Solution-Processed Ultraviolet Photodetectors Based on Colloidal ZnO Nanoparticles", 8, 6, 2008, 1649-1653.*
Fawen Gao et al., "A nanocomposite ultraviolet photodector based on interfacial trap-controlled charge injection", Nature Nanotechnology, 7, Dec. 2012, 798-802.*
Huang, Jinsong, et al., "Highly Efficient Red-Emission Polymer Phosphorescent Light-Emitting Diodes Based on Two Novel Tris(1-phenylisoquinolinato-C2,N)iridium(III) Derivatives", Adv. Mater., 2007, 19, 739-743.*
Arnold et al., "Broad Spectral Response Using Carbon Nanotube/Organic Semiconductor/$C_{60}$ Photodetectors," *NANO* Letters, 2009, 9:3354-3358.
Gong et al., "High-Detectivity Polymer Photodetectors with Spectral Response form 300 nm to 1450 nm," *Science*, 2009, 325:1665-1667.
Huynh et al., "Hybrid Nanorod-Polymer Solar Cells," *Science*, 2002, 295:2425-2427.
Jadhav et al., "Singlet Exciton fission in Nanostructured Organic Solar Cells," *NANO* Letters, 2011, 11:1495-1498.
Jin et al., "Solution-Processed Ultraviolet Photodectectors Based on Colloidal ZnO Nanoparticles," *NANO* Letters, 2008, 8:1649-1653.
Kind et al., "Nanowire Ultraviolet Photodetectors and Optical Switches," *Advanced Materials*, 2002, 14:158-160.
Kline et al., "Highly Oriented Crystals at the Buried Interface in Polythiophene Thin-Film Transistors," *Nature Materials*, 2006, 5:222-228.
Knoll, Radiation Detection and Measurement, 3rd ed., 2000, John Wiley and Sons, Inc., 274-320.
Konstantatos and Sargent, "Nanostructured materials for photon detection," *Nature Nanotechnology*, 2010, 5:391-400.
Konstantatos et al., "Sensitive Solution-Processed Visible-Wavelength Photodetectors," *Nature Photonics*, 2007, 1:531-534.
Konstantatos et al., "Ultrasensitive Solution-Cast Quantum Dot Photodetectors," *Nature*, 2006, 442:180-183.
Li and Chou, "Solar-Blind Deep-UV Band-Pass Filter (250-350 Nm) Consisting of a Metal Nano-Grid Fabricated by Nanoimprint Lithography," *Optics Express*, 2010, 18:931-937.
Liang et al., "ZnO Schottky ultraviolet photodetectors," *Journal of Crystal Growth*, 2001, 225:110-113.
Liu, "Junction photodiodes," *Photonic Devices*, 2005, 966-986.
McCulloch et al., "Liquid-Crystalline Semiconducting Polymers with High Carge-Carrier Mobility," *Nature Materials*, 2006, 5:328-333.
Nozik et al., "Semiconductor Quantum Dots and Quantum Dot Arrays and Application of Multiple Exciton Generation to Third-Generation Photovoltaic Solar Cells," *Chemical Reviews*, 2010, 110:6873-6890.
Soci et al., "ZnO Nanowire UV Photodetectors with High Internal Gain," *NANO Letters*, 2007, 7:1003-1009.
Sukhovatkin et al., "Colloidal Quantum-Dot Photodetectors Exploiting Multiexciton Generation," *Science*, 2009, 324:1542.
Sun et al., "Photovoltaic Devices Using Blends of Branched CdSe Nanoparticles and Conjugated Polymers," *Nano Letters*, 2003, 3:961-963.
Takahashi and Watanabe, Recent Progress in CdTe and CdZnTe Detectors, *IEEE Transactions on Nuclear Science*, 2001, 48:950-959.
Yoshikawa and Adachi, "Optical Constants of ZnO,"*Jpn. J. Appi. Phys.*, 1997, 36:6237.

\* cited by examiner

*Primary Examiner* — Douglas McGinty
(74) *Attorney, Agent, or Firm* — Fish & Richardson P.C.

(57) ABSTRACT

A photodetector includes an anode that is transparent or partially transparent to light, a cathode and an active layer disposed between the anode and the cathode. The active layer includes a nanocomposite material that has a polymer blended with nanoparticles or organic electron trapping particles. The photodetector has a low dark current when not illuminated by light and has a high conductivity when illuminated by light, in which the light passes the anode and is absorbed by the active layer.

48 Claims, 13 Drawing Sheets

NANOCOMPOSITE PHOTODETECTOR

CROSS-REFERENCE TO RELATED APPLICATIONS

This application claims priority to U.S. provisional application 61/673,787, filed on Jul. 20, 2012, which is incorporated herein by reference in its entirety.

STATEMENT AS TO FEDERALLY SPONSORED RESEARCH

This invention was made with government support under grant DOD-DTRA #HDTRA 1-10-1-0098. The government has certain rights in the invention.

TECHNICAL FIELD

This subject matter is generally related to nanocomposite photodetectors.

BACKGROUND

Ultraviolet photodetectors are useful in medical, communications, and defense applications. The photodetectors can include single crystalline silicon, silicon carbide, or gallium nitride p-n junction photodiodes. When the p-n junction of a photodiode is illuminated by light, photons excite electrons, causing free electrons and holes to be generated. Due to the built-in electric field at the depletion region, the free electrons move toward the cathode and the holes move toward the anode, producing a photocurrent that can be measured.

SUMMARY

In general, in one aspect, a photodetector includes an anode; a cathode; an active layer disposed between the anode and the cathode, the active layer including at least one of nanoparticles or organic electron trapping particles; a first buffer layer disposed between the active layer and the anode; and a second buffer layer disposed between the active layer and the cathode, in which the first buffer layer blocks conduction of electrons and the second buffer layer blocks conduction of holes to reduce a dark current through the photodetector when the photodetector is not illuminated by light.

Implementations of the photodetector may include one or more of the following features.

The nanoparticles can include at least one of zinc oxide (ZnOx), titanium oxide (TiOx), tin oxide (SnOx), zinc sulfide (ZnS), cadmium sulfide (CdS), lead sulfides (PbS), iron sulfide (FeS), iron pyrite (FeS2), cadmium selenide (CdSe), lead selenide (PbSe), cadmium telluride (CdTe), lead telluride (PbTe), Si, Ge, InAs, InSb, $Pb_{1-x}Sn_xTe$, $Hg_{1-x}Cd_xTe$, InAsSb, InNSb, InBiTe, or InTlSb.

The nanoparticles can include at least one of InAs/GaInSb super lattice, HgTe/CdTe super lattice, graphene quantum dots, carbon nanotube, or fullerene.

The active layer can include a polymer.

The active layer can include at least one of polyvinylcarbazole (PVK), poly(3-hexylthiophene) (P3HT), poly[4,8-bis-(2-ethyl-hexyl-thiophene-5-yl)-benzo[1,2-b:4,5-b'] dithiophene-2,6-diyl]-alt-[2-(2'-ethyl-hexanoyl)-thieno[3,4-b]thiophen-4,6-diyl (PBDTTT-CT), phthalocyanine complex, a porphyrin complex, a polythiophene (PT), a derivative of polythiophene, a polycarbazole, a derivative of polycarbazole, a poly(p-phenylene vinylene) (PPV), a derivative of poly(p-phenylene vinylene), a polyfluorene (PF), a derivative of polyfluorene, a cyclopentadithiophene-based polymer, a benzodithiophene (BDT)-based polymer, a polythiophene, a derivative of polythiophene, a polycarbazole, a derivative of polycarbazole, poly(3-octylthiophene) (P3OT), poly(3-hexyloxythiophene) (P3DOT), poly(3-methylthiophene) (PMeT), poly(3-dodecylthiophene) (P3DDT), poly (3-dodecylthienylenevinylene) (PDDTV), poly(3,3 dialkyl-quarterthiophene) (PQT), poly-dioctyl-fluorene-co-bithiophene (F8T2), poly-(2,5,-bis(3-alkylthiophene-2-yl) thieno[3,2-b]thiophene) (PBTTT-C12), poly[2,7-(9,9'-dihexylfluorene)-alt-2,3-dimethyl-5,7-dithien-2-yl-2,1,3-benzothiadiazole] (PFDDTBT), poly{[2,7-(9,9-bis-(2-ethylhexyl)-fluorene)]-alt-[5,5-(4,7-di-20-thienyl-2,1,3-benzothiadiazole)]} (BisEH-PFDTBT), poly{[2,7-(9,9-bis-(3,7-dimethyl-octyl)-fluorene)]-alt-[5,5-(4,7-di-20-thienyl-2,1,3-benzothiadiazole)]} (BisDMO-PFDTBT), poly[N-9"-hepta-decanyl-2,7-carbazole-alt-5,5-(4',7'-di-2-thienyl-2',1', 3'-benzothiadiazole)] (PCDTBT), or a combination of two or more of the above materials.

The anode can include at least one of indium tin oxide (ITO), fluorine-doped tin oxide (FTO), aluminum-doped zinc oxide (AZO), antimony-tin mixed oxide (ATO), a conductive polymer, a network of metal nanowire, a network of carbon nanowire, nanotube, nanosheet, nanorod, carbon nanotube, silver nanowire, or graphene.

The cathode can include at least one of aluminum, calcium, magnesium, lithium, sodium, potassium, strontium, cesium, barium, iron, cobalt, nickel, copper, silver, zinc, tin, samarium, ytterbium, chromium, gold, graphene, an alkali metal fluoride, an alkaline-earth metal fluoride, an alkali metal chloride, an alkaline-earth metal chloride, an alkali metal oxide, an alkaline-earth metal oxide, a metal carbonate, a metal acetate, or a combination of two or more of the above materials.

The first buffer layer can include at least one of an organic materials or self-assembled monolayers (SAMs).

The first buffer layer can include at least one of poly(3, 4-ethylenedioxithiophene) (PEDOT) doped with poly(styrene sulfonicacid) (PSS), 4,4'-bis[(ptrichlorosilylpropylphenyl)phenylamino]biphenyl (TPD-Si2), poly(3-hexyl-2,5-thienylene vinylene) (P3HTV) and C60, copper phthalocyanine (CuPc), poly[3,4-(1hydroxymethyl)ethylenedioxythiophene] (PHEDOT), n-dodecylbenzenesulfonic acid/hydrochloric acid-doped poly(aniline) nanotubes (a-PANIN)s, poly(styrenesulfonic acid)-graft-poly(aniline) (PSSA-g-PANI), poly[(9,9-dioctylfluorene)-co-N-(4-(1-methylpropyl)phenyl)diphenylamine] (PFT), 4,4'-bis[(p-trichlorosilylpropylphenyl) phenylamino]biphenyl (TSPP), 5,5'-bis[(p-trichlorosilylpropylphenyl) phenylamino]-2,20-bithiophene (TSPT), N-propyltriethoxysilane, 3,3,3-trifluoropropyltrichlorosilane or 3-aminopropyltriethoxysilane, $V_2O_5$, VOx, $MoO_3$, $WO_3$, $ReO_3$, NiOx, AgOx/PEDOT:PSS, $Cu_2O$, CuSCN/P3HT, or Au nanoparticles.

The second buffer layer can include at least one of an alkali metal compound, a metal oxide, an organic material, or self-assembled monolayers (SAMs).

The second buffer layer can include at least one of LiF, CsF, $LiCoO_2$, $Cs_2CO_3$, TiOx, $TiO_2$ nanorods (NRs), ZnO, ZnO nanorods (NRs), ZnO nanoparticles (NPs), ZnO, $Al_2O_3$, CaO, bathocuproine (BCP), copper phthalocyanine (CuPc), pentacene, pyronin B, pentadecafluorooctyl phenyl-C60-butyrate (F-PCBM), C60, C60/LiF, ZnO NRs/PCBM, ZnO/cross-linked fullerene derivative (C-PCBSD), single walled carbon nanotubes (SWCNT), poly(ethylene glycol) (PEG), poly(dimethylsiloxane-block-methyl methacrylate)

(PDMS-b-PMMA), polar polyfluorene (PF-EP), polyfluorene bearing lateral amino groups (PFN), polyfluorene bearing quaternary ammonium groups in the side chains (WPF-oxy-F), polyfluorene bearing quaternary ammonium groups in the side chains (WPF-6-oxy-F), fluorene alternating and random copolymer bearing cationic groups in the alkyl side chains (PFNBr-DBT15), fluorene alternating and random copolymer bearing cationic groups in the alkyl side chains (PFPNBr), or poly(ethylene oxide) (PEO).

The active layer can absorb light having a wavelength in a first predetermined range. The anode can be transparent or partially transparent to light having a wavelength in a second predetermined range, the second predetermined range overlapping the first predetermined range in a third predetermined range. The photodetector can have a high resistivity when not illuminated by light and have a low resistivity when illuminated by light having a wavelength in the third predetermined range.

The organic electron trapping particles can include at least one of a fullerene, a derivative of fullerene, a perylene derivative, a 2,7-dicyclohexyl benzo, phenanthroline derivative, a 1,4-diketo-3,6-dithienylpyrrolo[3,4-c]pyrrole (DPP) derivative, a tetracyanoquinodimethane (TCNQ) derivative, indene-C60 bisadduct ([60]ICBA), indene-C70 bisadduct ([70]ICBA), a poly(p-pyridyl vinylene) (PPyV) derivative, a 9,9'-bifluorenylidene (99BF) derivative, a benzothiadiazole (BT) derivative, [6,6]-phenyl C61-butyric acid methyl ester (PCBM), [6,6]-phenyl C61-butyric acid methyl ester (PC70BM), [6,6]-(4-fluoro-phenyl)-C61-butyric acid methyl ester (FPCBM), carbon 60 (C60), carbon 70 (C70), carbon nanotube (CNT), a carbon onion, or a combination of two or more of the above material.

In general, in another aspect, a photodetector array includes a plurality of anode lines that are individually selectable; a plurality of cathode lines that are individually selectable; and an active layer disposed between the anode lines and cathode lines. The active layer includes at least one of nanoparticles or organic electron trapping particles, in which each intersection of one of the anode lines and one of the cathode lines form an individually selectable photodetector.

Implementations of the photodetector array may include one or more of the following features.

The photodetector array can include a first buffer layer disposed between the active layer and the anode lines, and a second buffer layer disposed between the active layer and the cathode lines. The first buffer layer has a higher hole conductivity compared to that of the second buffer layer, and the second buffer layer has a higher electron conductivity compared to that of the first buffer layer.

The photodetector array can include a controller configured to receive an address signal and select one of the photodetectors based on the address signal.

The nanoparticles can include at least one of zinc oxide (ZnOx), titanium oxide (TiOx), tin oxide (SnOx), zinc sulfide (ZnS), cadmium sulfide (CdS), lead sulfides (PbS), iron sulfide (FeS), iron pyrite (FeS2), cadmium selenide (CdSe), lead selenide (PbSe), cadmium telluride (CdTe), lead telluride (PbTe), Si, Ge, InAs, InSb, $Pb_{1-x}Sn_xTe$, $Hg_{1-x}Cd_xTe$, InAsSb, InNSb, InBiTe, or InTlSb.

The nanoparticles can include at least one of InAs/GaInSb super lattice, HgTe/CdTe super lattice, graphene quantum dots, carbon nanotube, or fullerene.

The active layer can absorb light having a wavelength in a first predetermined range. The anode lines can be transparent or partially transparent to light having a wavelength in a second predetermined range, the second predetermined range overlapping the first predetermined range in a third predetermined range. Each photodetector can have a high resistivity when not illuminated by light and have a low resistivity when illuminated by light having a wavelength in the third predetermined range.

In general, in another aspect, a photodetector includes an anode that is transparent or partially transparent to light having a wavelength in a first predetermined range; a cathode; and an active layer disposed between the anode and the cathode. The active layer includes at least one of nanoparticles or organic electron trapping particles, and the active layer absorbs light having a wavelength in a second predetermined range, the second predetermined range overlapping the first predetermined range in a third predetermined range. The photodetector has a high resistivity when not illuminated by light and has a low resistivity when illuminated by light having a wavelength in the third predetermined range.

Implementations of the photodetector may include one or more of the following features.

The photodetector can include a first buffer layer disposed between the active layer and the anode, and a second buffer layer disposed between the active layer and the cathode. The first buffer layer can have a higher hole conductivity compared to that of the second buffer layer, and the second buffer layer can have a higher electron conductivity compared to that of the first buffer layer.

The first buffer layer can include at least one of organic materials or self-assembled monolayers (SAMs).

The first buffer layer can include at least one of poly(3,4-ethylenedioxithiophene) (PEDOT) doped with poly(styrene sulfonicacid) (PSS), 4,4"-bis[(ptrichlorosilylpropylphenyl)phenylamino]biphenyl (TPD-Si2), poly(3-hexyl-2,5-thienylene vinylene) (P3HTV) and C60, copper phthalocyanine (CuPc), poly[3,4-(1hydroxymethyl)ethylenedioxythiophene] (PHEDOT), n-dodecylbenzenesulfonic acid/hydrochloric acid-doped poly(aniline) nanotubes (a-PANIN)s, poly(styrenesulfonic acid)-graft-poly(aniline) (PSSA-g-PANI), poly[(9,9-dioctylfluorene)-co-N-(4-(1-methylpropyl)phenyl)diphenylamine] (PFT), 4,4"-bis[(p-trichlorosilylpropylphenyl) phenylamino]biphenyl (TSPP), 5,5'-bis[(p-trichlorosilylpropylphenyl) phenylamino]-2,20-bithiophene (TSPT), N-propyltriethoxysilane, 3,3,3-trifluoropropyltrichlorosilane or 3-aminopropyltriethoxysilane, $V_2O_5$, VOx, $MoO_3$, $WO_3$, $ReO_3$, NiOx, AgOx/PEDOT:PSS, $Cu_2O$, CuSCN/P3HT, or Au nanoparticles.

The second buffer layer can include at least one of an alkali metal compound, a metal oxide, an organic material, or self-assembled monolayers (SAMs).

The second buffer layer can include at least one of LiF, CsF, $LiCoO_2$, $Cs_2CO_3$, TiOx, $TiO_2$ nanorods (NRs), ZnO, ZnO nanorods (NRs), ZnO nanoparticles (NPs), ZnO, $Al_2O_3$, CaO, bathocuproine (BCP), copper phthalocyanine (CuPc), pentacene, pyronin B, pentadecafluorooctyl phenyl-C60-butyrate (F-PCBM), C60, C60/LiF, ZnO NRs/PCBM, ZnO/cross-linked fullerene derivative (C-PCBSD), single walled carbon nanotubes (SWCNT), poly(ethylene glycol) (PEG), poly(dimethylsiloxane-block-methyl methacrylate) (PDMS-b-PMMA), polar polyfluorene (PF-EP), polyfluorene bearing lateral amino groups (PFN), polyfluorene bearing quaternary ammonium groups in the side chains (WPF-oxy-F), polyfluorene bearing quaternary ammonium groups in the side chains (WPF-6-oxy-F), fluorene alternating and random copolymer bearing cationic groups in the alkyl side chains (PFNBr-DBT15), fluorene alternating and random copolymer bearing cationic groups in the alkyl side chains (PFPNBr), or poly(ethylene oxide) (PEO).

The nanoparticles can include at least one of zinc oxide (ZnOx), titanium oxide (TiOx), tin oxide (SnOx), zinc sulfide (ZnS), cadmium sulfide (CdS), lead sulfides (PbS), iron sulfide (FeS), iron pyrite (FeS2), cadmium selenide (CdSe), lead selenide (PbSe), cadmium telluride (CdTe), lead telluride (PbTe), Si, Ge, InAs, InSb, $Pb_{1-x}Sn_xTe$, $Hg_{1-x}Cd_xTe$, InAsSb, InNSb, InBiTe, or InTlSb.

The nanoparticles can include at least one of InAs/GaInSb super lattice, HgTe/CdTe super lattice, graphene quantum dots, carbon nanotube, or fullerene.

The active layer can include a polymer.

The active layer can include at least one of polyvinylcarbazole (PVK), poly(3-hexylthiophene) (P3HT), poly[4,8-bis-(2-ethyl-hexyl-thiophene-5-yl)-benzo[1,2-b:4,5-b'] dithiophene-2,6-diyl]-alt-[2-(2'-ethyl-hexanoyl)-thieno[3,4-b] thiophen-4,6-diyl (PBDTTT-CT), phthalocyanine complex, a porphyrin complex, a polythiophene (PT), a derivative of polythiophene, a polycarbazole, a derivative of polycarbazole, a poly(p-phenylene vinylene) (PPV), a derivative of poly(p-phenylene vinylene), a polyfluorene (PF), a derivative of polyfluorene, a cyclopentadithiophene-based polymer, a benzodithiophene (BDT)-based polymer, a polythiophene, a derivative of polythiophene, a polycarbazole, a derivative of polycarbazole, poly(3-octylthiophene) (P3OT), poly(3-hexyloxythiophene) (P3DOT), poly(3-methylthiophene) (PMeT), poly(3-dodecylthiophene) (P3DDT), poly(3-dodecylthienylenevinylene) (PDDTV), poly(3,3 dialkylquarterthiophene) (PQT), poly-dioctyl-fluorene-co-bithiophene (F8T2), poly-(2,5,-bis(3-alkylthiophene-2-yl)thieno[3,2-b]thiophene) (PBTTT-C12), poly[2,7-(9,9'-dihexylfluorene)-alt-2,3-dimethyl-5,7-dithien-2-yl-2,1,3-benzothiadiazole] (PFDDTBT), poly {[2,7-(9,9-bis-(2-ethylhexyl)-fluorene)]-alt-[5,5-(4,7-di-20-thienyl-2,1,3-benzothiadiazole)]} (BisEH-PFDTBT), poly {[2,7-(9,9-bis-(3,7-dimethyl-octyl)-fluorene)]-alt-[5,5-(4,7-di-20-thienyl-2,1,3-benzothiadiazole)]} (BisDMO-PFDTBT), poly[N-9"-hepta-decanyl-2,7-carbazole-alt-5,5-(4',7'-di-2-thienyl-2',1',3'-benzothiadiazole)] (PCDTBT), or a combination of two or more of the above materials.

The anode can include at least one of indium tin oxide (ITO), fluorine-doped tin oxide (FTO), aluminum-doped zinc oxide (AZO), antimony-tin mixed oxide (ATO), a conductive polymer, a network of metal nanowire, a network of carbon nanowire, nanotube, nanosheet, nanorod, carbon nanotube, silver nanowire, or graphene.

The cathode can include at least one of aluminum, calcium, magnesium, lithium, sodium, potassium, strontium, cesium, barium, iron, cobalt, nickel, copper, silver, zinc, tin, samarium, ytterbium, chromium, gold, graphene, an alkali metal fluoride, an alkaline-earth metal fluoride, an alkali metal chloride, an alkaline-earth metal chloride, an alkali metal oxide, an alkaline-earth metal oxide, a metal carbonate, a metal acetate, or a combination of two or more of the above materials.

The organic electron trapping particles can include at least one of a fullerene, a derivative of fullerene, a perylene derivative, a 2,7-dicyclohexyl benzo, phenanthroline derivative, a 1,4-diketo-3,6-dithienylpyrrolo[3,4-c]pyrrole (DPP) derivative, a tetracyanoquinodimethane (TCNQ) derivative, indene-C60 bisadduct ([60]ICBA), indene-C70 bisadduct ([70]ICBA), a poly(p-pyridyl vinylene) (PPyV) derivative, a 9,9'-bifluorenylidene (99BF) derivative, a benzothiadiazole (BT) derivative, [6,6]-phenyl C61-butyric acid methyl ester (PCBM), [6,6]-phenyl C61-butyric acid methyl ester (PC70BM), [6,6]-(4-fluoro-phenyl)-C61-butyric acid methyl ester (FPCBM), carbon 60 (C60), carbon 70 (C70), carbon nanotube (CNT), a carbon onion, or a combination of two or more of the above material.

In general, in another aspect, a method for detecting light is provided. The method includes applying a bias voltage across a cathode and an anode of a photodetector, the photodetector having an active layer disposed between the cathode and the anode, the active layer including at least one of nanoparticles or organic electron trapping particles; and detecting light by transmitting the light through the anode to the active layer, absorbing the light in the active layer, and increasing a current flowing through the photodetector.

Implementations of the method may include one or more of the following features.

The method can include reducing a dark current of the photodetector when there is no light by using a first buffer layer to block conduction of electrons, the first buffer layer being disposed between the active layer and the anode, and using a second buffer layer to block conduction of holes, the second buffer layer being disposed between the active layer and the cathode.

The method can include, upon absorbing light at the active layer, producing electrons and holes from an interaction of the light and materials in the active layer, and trapping the electrons using the nanoparticles or the organic electron trapping particles.

In general, in another aspect, a method for detecting light is provided. The method includes applying a bias voltage across a cathode and an anode of a photodetector, the photodetector having an active layer disposed between the cathode and the anode, the active layer including at least one of nanoparticles or organic electron trapping particles. When the photodetector is not illuminated by light, the photodetector is operated in a first mode comparable to a photodiode having a rectifying Schottky contact; and when the photodetector is illuminated by light, the photodetector is operated in a second mode comparable to a photoconductor having an Ohmic contact.

Implementations of the method may include one or more of the following features.

The method can include, when the photodetector is illuminated by light, transmitting the light through the anode to the active layer, absorbing the light in the active layer, and increasing a current flowing through the photodetector.

The method can include, when the photodetector is not illuminated by light, reducing a dark current of the photodetector by using a first buffer layer to block conduction of electrons, the first buffer layer being disposed between the active layer and the anode, and using a second buffer layer to block conduction of holes, the second buffer layer being disposed between the active layer and the cathode.

These aspects and features allow a photodetector to have a high signal-to-noise ratio when detecting light.

DETAILED DESCRIPTION

This disclosure relates to a photodetector having a nanocomposite layer. In some implementations, the photodetector includes an active layer made of a polymer material blended with nanoparticles (NPs). For example, a solution-processed UV-photodetector having a nanocomposite active layer that includes ZnO nanoparticles blended with semiconducting polymers can have a high signal-to-noise ratio when detecting UV light.

Due to interfacial trap-controlled charge injection, the photodetector transitions from having characteristics similar to a photodiode with a rectifying Schottky contact in the dark to having characteristics similar to a photoconductor with an ohmic contact under illumination. The photodetector has a low dark current comparable to a photodiode and a high responsivity of, e.g., 721~1,001 A/W, which is comparable to a photoconductor. In some implementations, when a bias voltage of less than 10V is applied, the photodetector can provide a detectivity of $3.4 \times 10^{15}$ Jones at 360 nm at room temperature.

Figure 1:
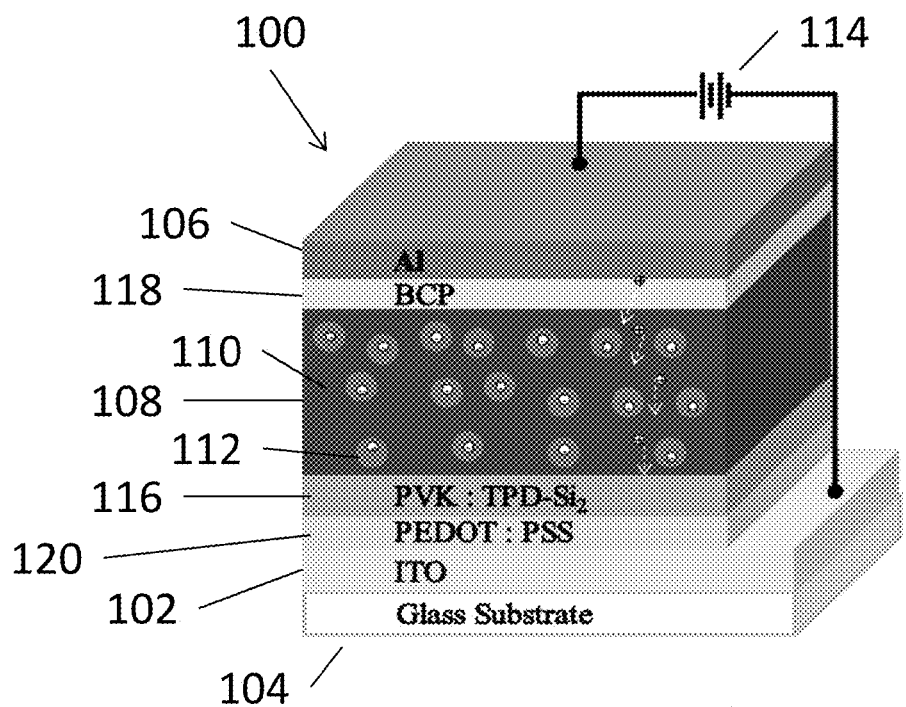
FIG. 1 is a diagram of a photodetector.

Referring to FIG. 1, a photoconductive photodetector 100 includes an anode 102 formed on a substrate 104, a cathode 106, and a photoactive layer 108 disposed between the anode 102 and the cathode 106. For example, the substrate 104 can be a glass substrate, the anode 102 can be made of transparent indium tin oxide (ITO), and the cathode 106 can be made of aluminum. The photoactive layer 108 includes a polymer 110 blended with nanoparticles 112. In some examples, the polymer 110 is a hole-conducting semiconductor polymer, and the nanoparticles 110 are selected to trap electrons. A bias voltage 114 is applied across the anode 102 and the cathode 106. When the photodetector 100 is illuminated by light, the light causes generation of electron-hole pairs in the active layer 108, in which the electrons are trapped by the nanoparticles 112. As described below, this changes the energy band levels resulting in an increase in the current flowing through the photodetector 100, enabling detection of the light.

The photoconductive photodetector 100 is sometimes referred to as a "vertical structure" photoconductive photodetector 100 because the cathode 106, the active layer 108, and the anode 102 are stacked vertically. This is in comparison to a previous "lateral structure" photodetector design in which both the cathode and the anode are placed on the same side of the active layer.

The polymer 110 and the nanoparticles 112 can be selected based on the spectrum of light that the photodetector 100 is intended to detect. For example, for a photodetector 100 designed to detect ultraviolet (UV) and visible light, the polymer 110 can be made of poly-3(hexylthiophene) (P3HT) that has an optical bandgap of 1.9 eV. For a photodetector 100 designed to detect ultraviolet (UV) light, the polymer 110 can be made of polyvinylcarbazole (PVK) that has a bandgap of 3.5 eV. PVK has a high hole mobility and a high bandgap. In both of the above examples, the nanoparticles can be ZnO nanoparticles. ZnO is suitable as a UV absorber because of its wide bandgap of about 3.4 eV.

In some examples, the nanoparticles 112 can be dispersed in the polymer 110 so that the nanoparticles do not contact each other. This way, the nanoparticles form isolated electron traps. In some examples, the nanoparticles can be coated with nonconductive ligands. In some examples, the nanoparticles have defects that function as charge trappers.

The various layers of materials of the photodetector 100 can be fabricated by low-cost spin-coating, which is compatible with complementary metal-oxide-semiconductor (CMOS) fabrication technology.

In some implementations, the anode is transparent or partially transparent to light having a wavelength in a first predetermined range. The active layer includes nanoparticles that absorb light having a wavelength in a second predetermined range, in which the second predetermined range overlaps the first predetermined range in a third predetermined range. The photodetector has a high resistivity when not illuminated by light and has a low resistivity when illuminated by light having a wavelength in the third predetermined range.

Figure 2:
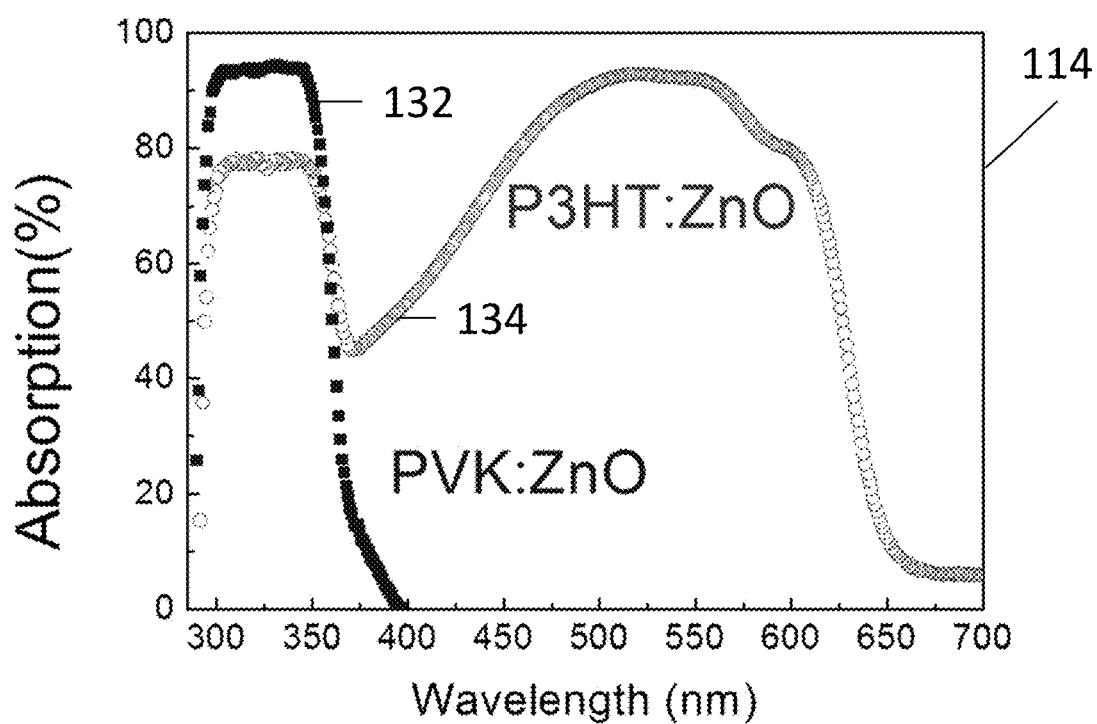
FIG. 2 is a graph showing the absorption spectra of two different active layers.

FIG. 2 is a graph 130 that shows an absorption spectrum 132 of PVK:ZnO nanocomposite material and an absorption spectrum 134 of P3HT:ZnO nanocomposite material. The absorption spectrum 132 indicates that the PVK:ZnO nanocomposite material absorbs UV light, so a photodetector having an active layer that includes PVK:ZnO nanocomposite material can detect UV light. The absorption spectrum 134 indicates that the P3HT:ZnO nanocomposite material absorbs UV and visible light, so a photodetector having an active layer that includes P3HT:ZnO nanocomposite material can detect UV light and light in the visible spectrum.

For example, the photoactive layer 108 can have a thickness of about 500 nm. There are many types of nanoparticles that can absorb UV radiation with high absorption coefficients. When the photoactive layer 108 includes the UV-absorbing nanoparticles, a thickness of 500 nm for the photoactive layer 108 can be sufficient for the photoactive layer 108 to absorb most of the UV radiation.

A feature of the photodetector 100 is that it has a gain comparable to a photoconductor and low noise comparable to a diode.

Figure 3:
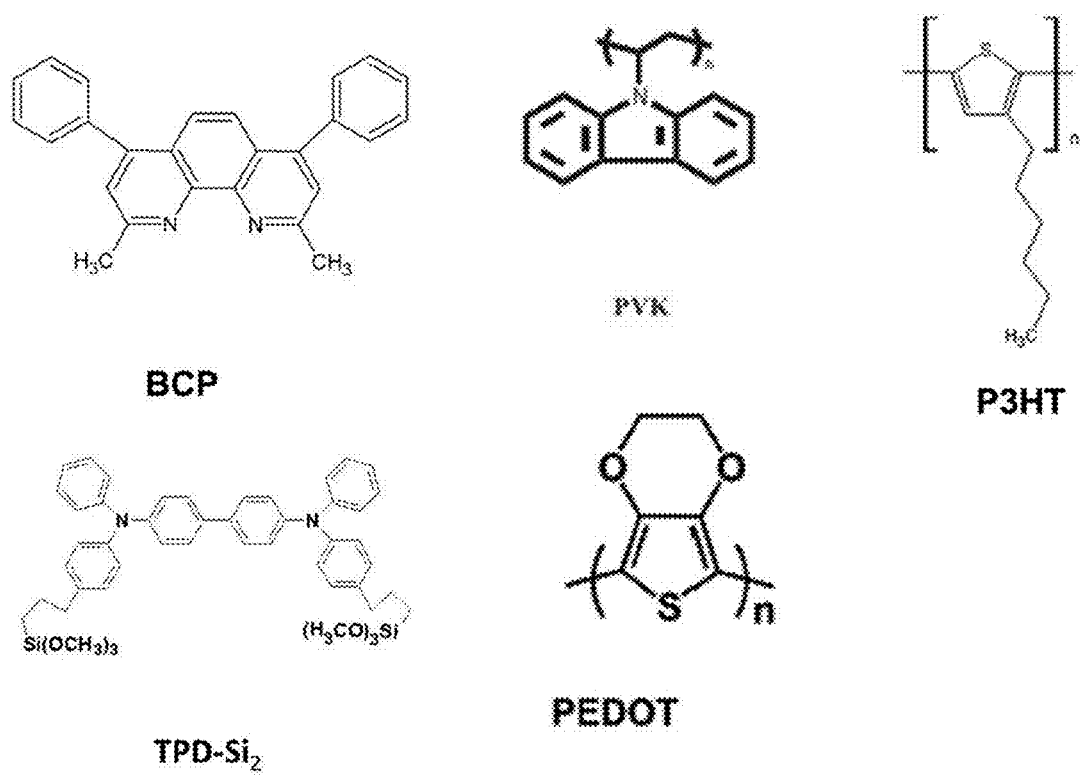
FIG. 3 is a diagram showing chemical structures of materials that can be used in the photodetector.
Figure 4:
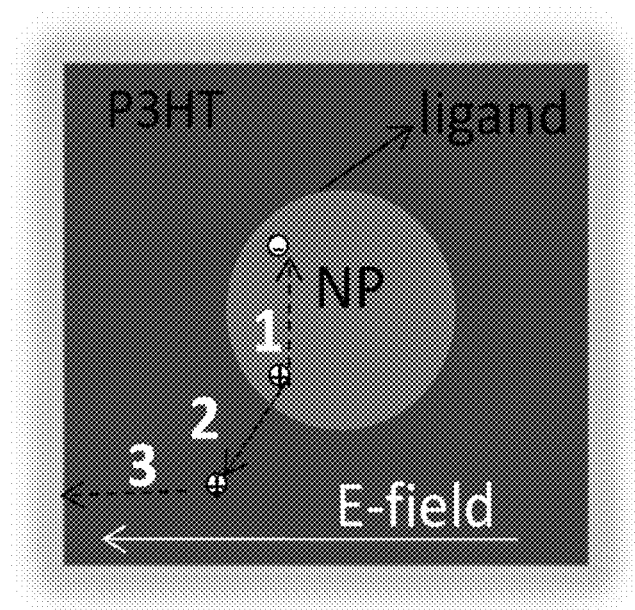
FIG. 4 is a diagram showing electron-hole pair generation, electron-hole separation, hole transport, and electron trapping process in a nanocomposite material.

The chemical structures of materials that can be used in the photodetector 100 are shown in FIG. 3. The nanoparticles work as charge traps in the photodetector 100. BCP and PVK are available from Sigma-Aldrich, PEDOT:PSS (PH4083) is available from H.C. Starck, and P3HT is available from Rieke Metals.

In order to reduce the dark current, a first buffer layer 116 is disposed between the anode 102 and the photoactive layer 108. The first buffer layer 116 functions as an electron-blocking/hole-conducting layer. For example, the first buffer layer 116 can be a thin layer of 4,4'-Bis[(p-trichlorosilyl-propylphenyl)phenylamino]-biphenyl (TPD-Si$_2$) and PVK blend. This material blend combines the hole-injection and hole-transport capabilities of TPD-Si$_2$ with the electron-blocking capability of PVK, and can reduce the dark current by two to three orders of magnitude in the photodetector 100. The hole-transport layer can be cross-linked by annealing TPD-Si$_2$ in air so that the photoactive layer coating that follows will not wash away this layer.

Similarly, a second buffer layer 118 is disposed between the cathode 106 and the photoactive layer 108. The second buffer layer 118 functions as a hole-blocking/electron-conducting layer. For example, the second buffer layer 118 can be a layer of 2,9-dimethyl-4,7-diphenyl-1,10-phenanthroline (BCP), which can be deposited by thermal evaporation on the cathode side.

An optional PEDOT:PSS layer 120 is provided above the ITO layer 102 to make the ITO layer 102 smooth.

Referring to FIGS. 4, 5, 6A, and 6B, the photodetector 100 operates as follows:

(1) When the photodetector 100 is illuminated by light, both the polymer 110 and the nanoparticles 112 absorb incident photons and generate Frenkel excitons.

Figure 5:
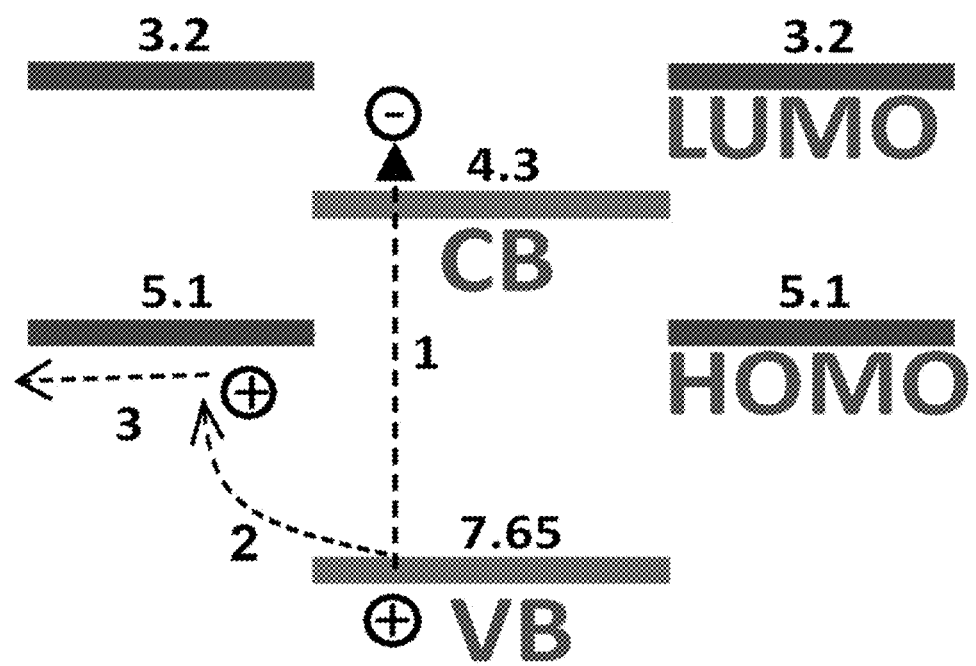
FIG. 5 is a diagram showing energy levels of the nanoparticle and the surrounding polymer.

(2) The Frenkel excitons diffuse to the polymer/nanoparticles interface and the electrons transfer from the nanoparticles and semiconducting polymer, as shown in the energy diagram of FIG. 5.

(3) The holes transport in the semiconducting polymer under the applied reverse bias/electric field, and the electrons remain trapped in the nanoparticles 112 due to the lack of a percolation network for electrons and the strong quantum confinement effect in the nanoparticles 112. The strong electron trapping effect is evidenced by the 3 to 4 orders of magnitude lower electron current in the electron-only devices than the hole current in the hole-only devices using the same nanocomposite layers as the carrier transport layer. The electron trapping effect by ZnO nanoparticles was also directly observed by electric force microscopy.

Figure 6A:
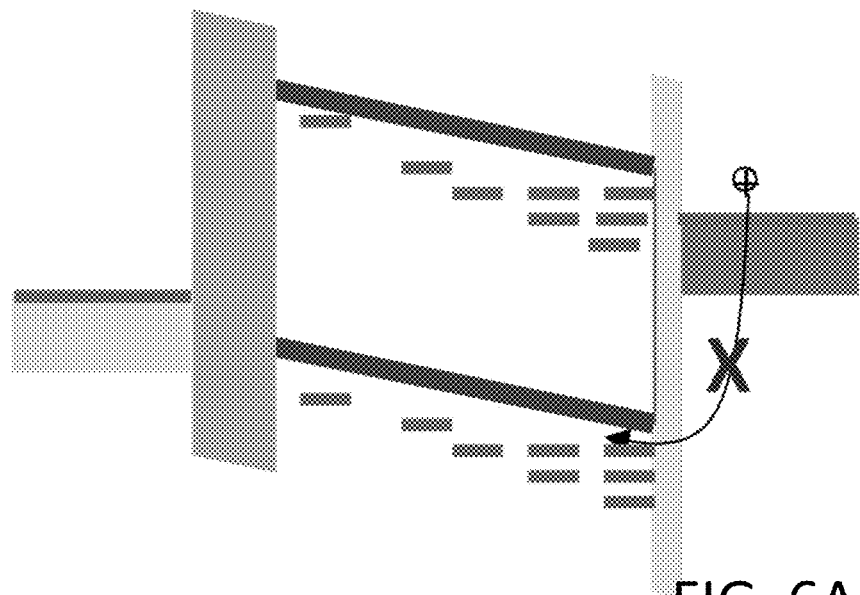
FIG. 6A is a diagram showing energy levels of the photodetector in the dark.

(4) As shown in FIG. 6A, in the absence of illumination, the dark current is small because of the large charge injection barrier (e.g., greater than 0.6 eV) under reverse bias. Under illumination, the trapped electrons quickly shift the lowest unoccupied molecular orbital (LUMO) of the polymer downwards and align the Fermi energy of the nanocomposite with that of the cathode 106. The electron traps are predominately close to the cathode because of the formation of vertical phase separation in the nanocomposite with ZnO nanoparticles segregated to the cathode side, as observed by the cross-section scanning electron microscopy (SEM). The phase separation (both lateral and vertical) has been observed in P3HT:ZnO nanocomposite and was promoted by the slow drying of the film due to the different surface affinity of ZnO and P3HT to the substrate.

Figure 6B:
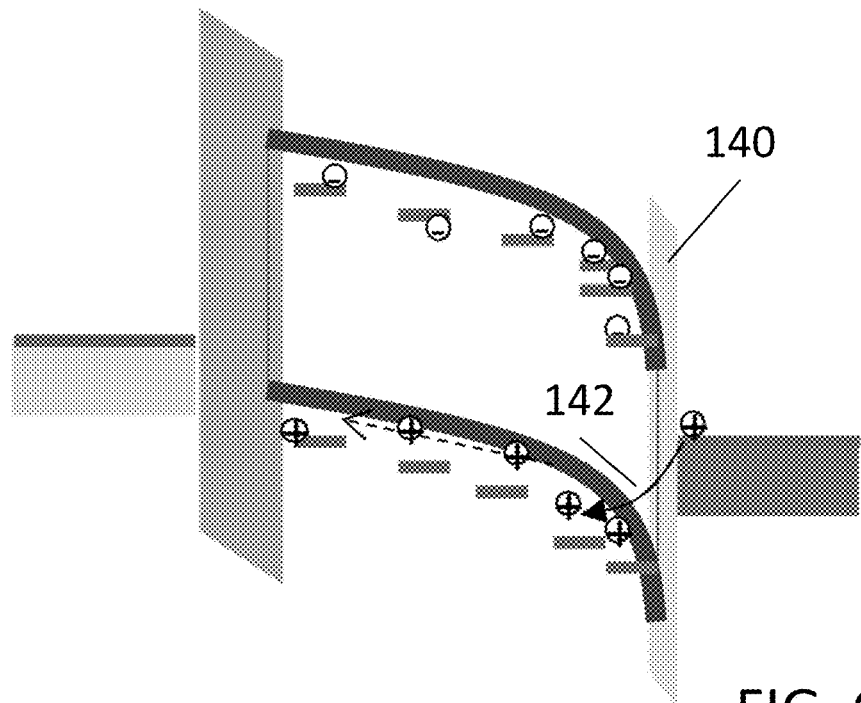
FIG. 6B is a diagram showing energy levels of the photodetector under illumination.

As shown in FIG. 6B, the thickness of a hole-injection barrier 140 on the cathode side becomes so small that the holes can easily tunnel (142) through it at a small reverse bias. Thus, the nanocomposite/Al interface acts as a photon addressable photoelectronic "valve" for hole injection and incident photons can switch on this valve. The average energy barrier change, $\Delta\Phi$, is a linear function of trapped electron density ($n_t$), while the injection current follows an exponential relationship with the energy barrier change according to the Richardson-Dushman equation:

$$J \propto \exp\left(-\frac{\Delta\Phi}{kT}\right) \propto \exp\left(\frac{n_t}{kT}\right) \quad \text{(Equ. 1)}$$

where k is the Boltzmann constant and T is the temperature. The gain of a photodetector is the ratio of the measured photocurrent (carriers) versus the number of incident photons. If the injected hole number exceeds the absorbed photon number, there is gain due to the exponential dependence of injected holes on incident photons.

Figure 7:
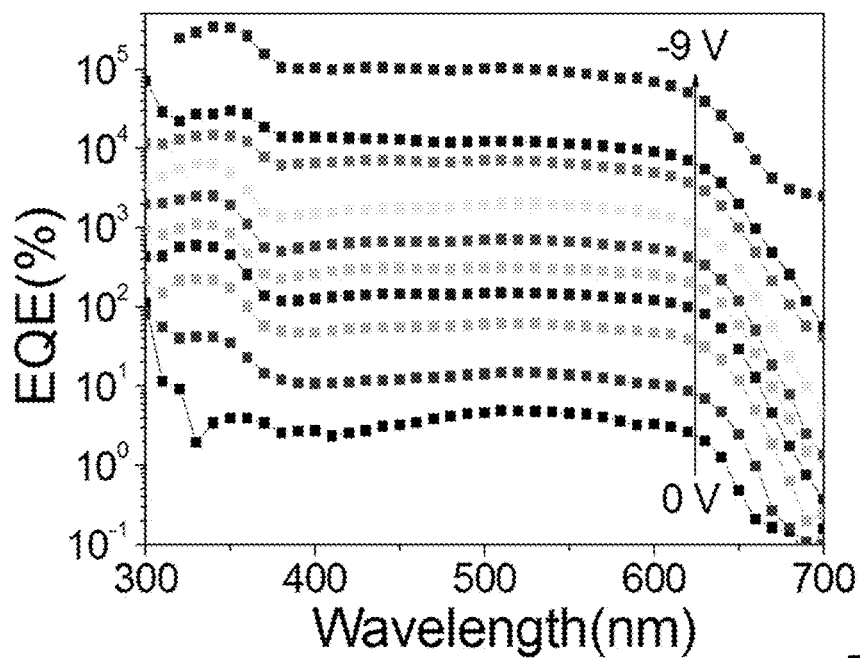
FIG. 7 is a graph showing external quantum efficiencies of a photodetector that uses an active layer having P3HT:ZnO under reverse bias with a voltage step of 1 V.
Figure 8:
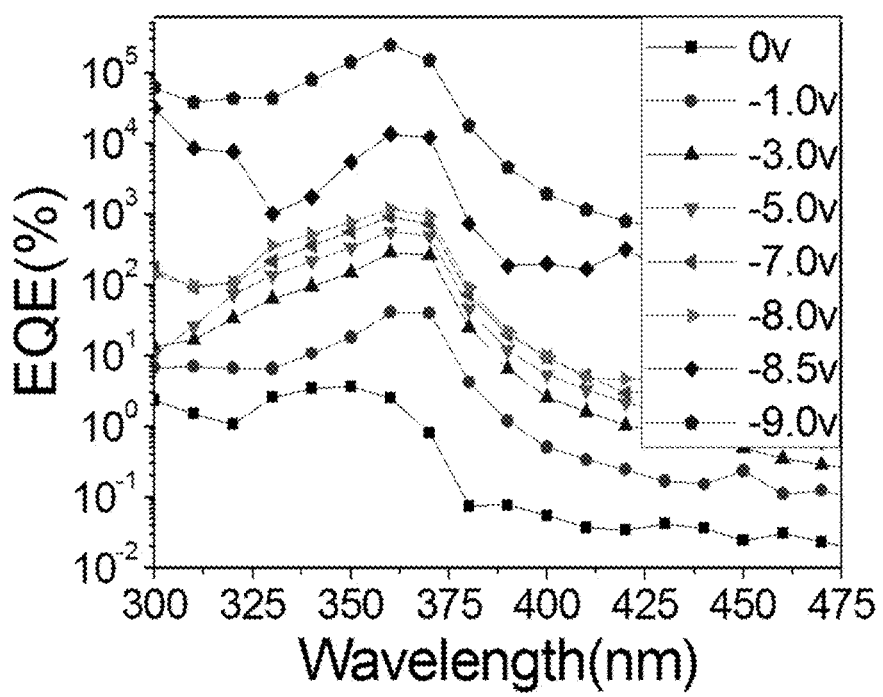
FIG. 8 is a graph showing external quantum efficiencies of a photodetector that uses an active layer having PVK:ZnO under reverse bias with a voltage step of 1 V.
Figure 9:
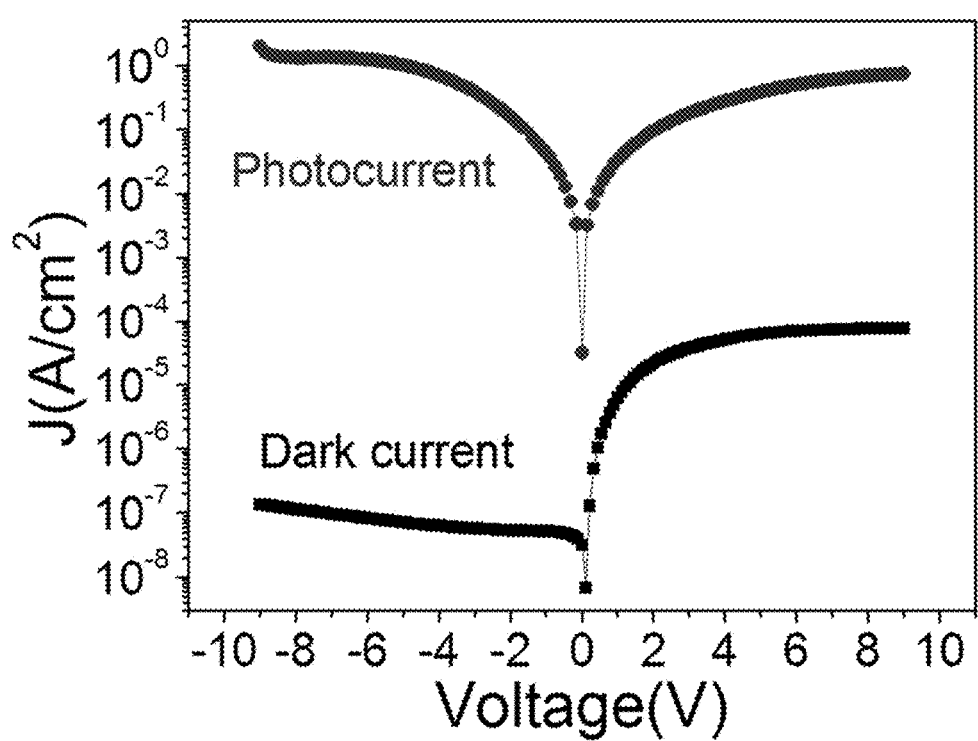
FIG. 9 is a graph showing photocurrent and dark current density of a photodetector that uses an active layer having PVK:ZnO nanocomposite material.

To characterize the wavelength-dependent gain of the photodetectors, the external quantum efficiencies (EQE) versus wavelength were measured by the incident-photon-to-current efficiency (IPCE) system at different reverse bias, and the results are shown in FIGS. 7 and 8. The EQE curves agree with the absorption curves of the nanocomposites as well. EQE exceeds 100% at a bias of −3 V for PVK:ZnO devices and −1 V for P3HT:ZnO devices, respectively. EQEs increase quickly with increasing negative bias, especially at reversed bias above −8 V. The rapid increase of EQE is consistent with the quick increase of photocurrents, as shown in FIG. 9. The measurements were performed for a bias voltage from −9V to 9V (the highest voltage output of the lock-in amplifier used for the measurement), and the peak external quantum efficiency is 245,300% and 340,600% under bias of −9 V at 360 nm for the PVK:ZnO and P3HT:ZnO devices, respectively. The corresponding responsivity (R in A/W), i.e., the ratio of photocurrent to incident-light intensity, can be calculated from EQE with $$R = EQE/h\nu \quad \text{(Equ. 2)}$$

where hν is the energy of the incident photon in terms of electron-volts. The peak responsivities, at illumination light intensity of 1.25 μW/cm$^2$, are 721 A/W for the PVK:ZnO device and 1,001 A/W for the P3HT:ZnO device at 360 nm, which are more than three orders of magnitude larger than that of commercial GaN or SiC detectors (e.g., less than 0.2 A/W). FIG. 9 shows that the photodetector 100 has a good signal-to-noise ratio when a bias voltage of less than 10 V is used.

Figure 10A:
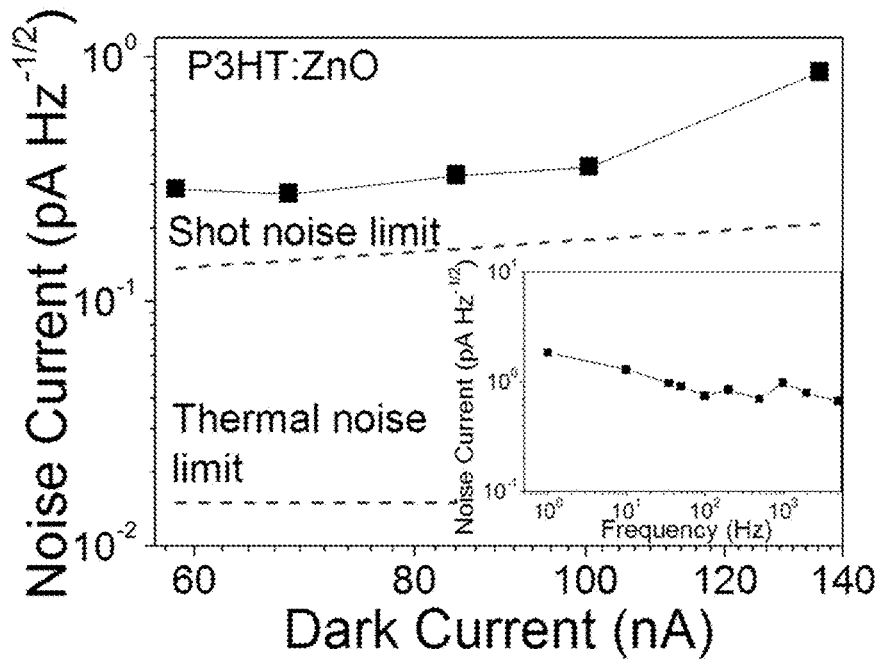
FIG. 10A is a graph showing a relationship between the noise current of a photodetector using P3HT:ZnO in the active layer and the dark current. The inset shows the frequency dependent noise current at −9 V.
Figure 10B:
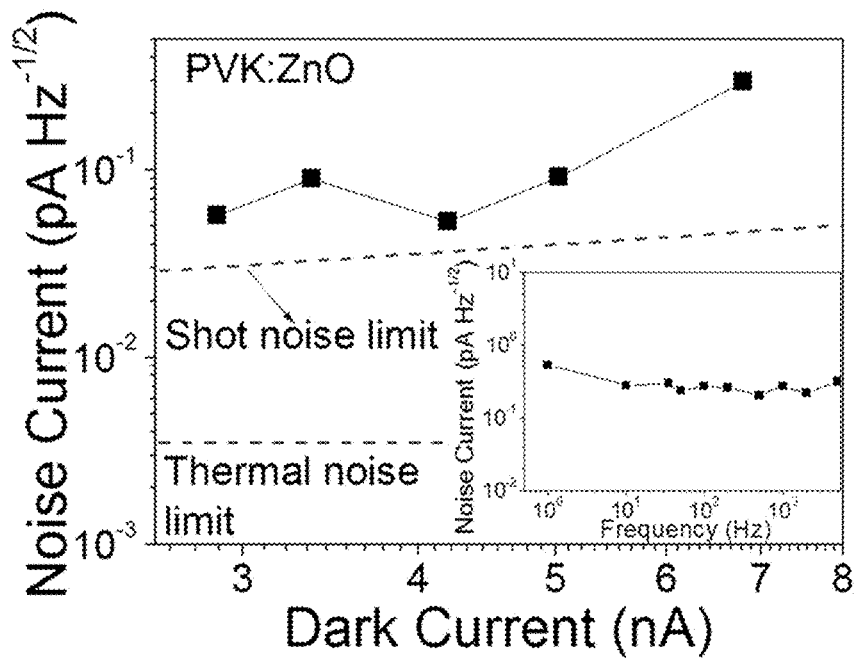
FIG. 10B is a graph showing a relationship between the noise current of a photodetector using PVK:ZnO in the active layer and the dark current. The inset shows the frequency dependent noise current at −9 V.

The nanocomposite photodetector devices show a transition from a photodiode in the dark with a rectifying Schottky contact to a photoconductor under light with an ohmic contact, as evidenced by the dark current and photocurrent in FIG. 9. A feature of the photodetector 100 is that it has a low dark current (comparable to that of a photodiode) and a large gain (comparable to that of a photoconductor), resulting in a high sensitivity. The figure of merit for a photodetector is the specific detectivity which characterizes the capability of a photodetector to detect the weakest light signal. In addition to responsivity, the other factor that limits the specific detectivity of a detector is the noise current. The dark current of the photodetector 100 can be, e.g., as low as 6.8 nA at −9 V bias voltage because of the use of the first and second buffer layers 116 and 118, which block the transport of electrons and holes at the anode and the cathode side, respectively, in dark condition, as shown in FIG. 9, which gives a very low shot noise. To include other possible noise, such as flicker noise and thermal noise, the total noise current of the photodetector was directly measured with a SR830 lock-in amplifier at different dark current density and frequency. As shown in FIGS. 10A and 10B, the measured total noise current was found to be dominated by the shot noise within the frequency range of 1 Hz to 5 kHz. The specific detectivities (D*) of a photodetector are given by:

$$D^* = \frac{(AB)^{1/2}}{NEP} \left(cm\, Hz^{\frac{1}{2}} W^{-1} \text{ or Jones}\right) \quad \text{(Equ. 3)}$$

$$NEP = \frac{\overline{i_n^2}^{1/2}}{R}(W) \quad \text{(Equ. 4)}$$

where A is the device area, B is the bandwidth, NEP is the noise equivalent power, $$\overline{i_n^2}^{1/2}$$

is the measured noise current, and R is the responsivity.

Figure 11:
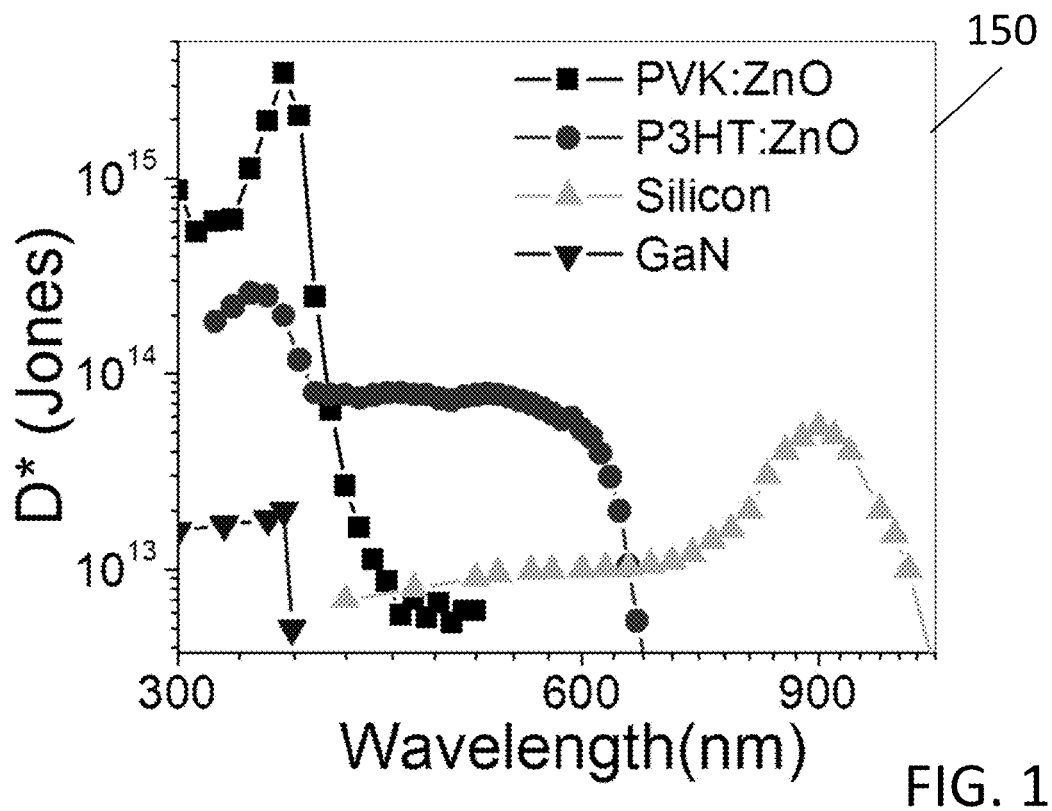
FIG. 11 is a graph showing specific detectivities of the photodetector at various wavelengths.

Referring to FIG. 11, a graph 150 shows the detectivities of the nanocomposite photodetector 100 that were calculated at different wavelengths with the measured noise current, responsivity at −9 V bias. At illumination light intensity of 1.25 µW/cm², the specific detectivities at 360 nm are 3.4× $10^{15}$ Jones for PVK:ZnO devices and 2.5×$10^{14}$ Jones for P3HT:ZnO devices. The specific detectivities in the UV range are 2 to 3 orders of magnitude larger than silicon and GaN UV detectors. The specific detectivity of a P3HT:ZnO device within the visible light range is also more than ten times better than that of silicon detectors.

Figure 12:
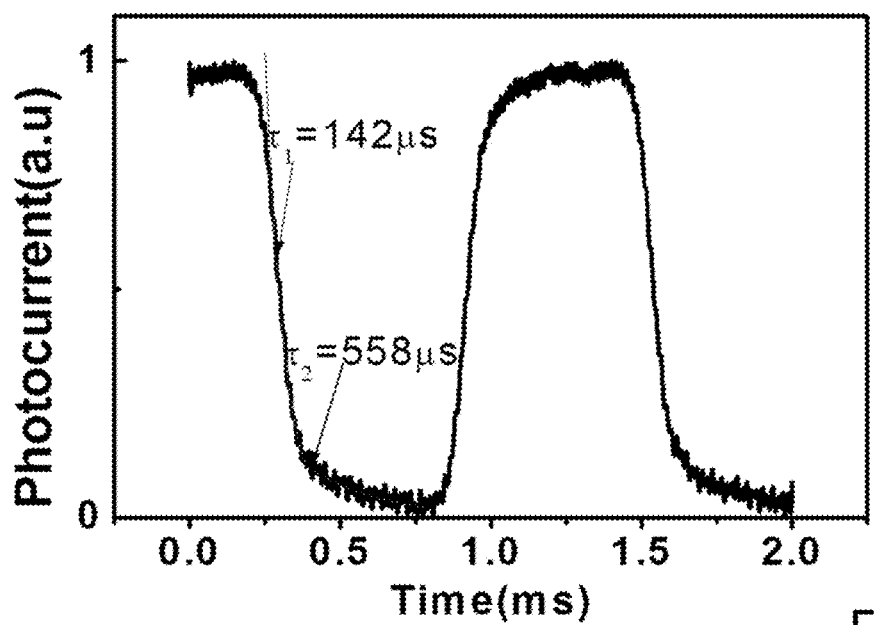
FIG. 12 is a graph showing the transient photo response waveform of a photodetector having a P3HT:ZnO active layer operating under a −9 V bias voltage.

An important parameter of the photodetector is the response speed. The temporal response of the nanocomposite detector was characterized by a chopper-generated short light pulse. FIG. 12 shows the transient photocurrent of the P3HT:ZnO device measured under a bias of −9 V at light intensity of 1 µW/cm². The transient response result shows a rise time (output signal to change from 10-90% of the peak output value) of 25 is which was limited by the rising edge of the light pulse from the optical chopper. The decay of the photocurrent after switching off the UV pulse has a fast component of 142 µs and a slow component of 558 µs, which indicates the existence of two channels for the recombination of holes. The 3-dB bandwidth is 9.4 kHz. The photodetector 100 provides several orders of magnitude in improvement in gain-bandwidth product compared to previous photodetectors. The multiple-exponential decay time can be caused by the electron traps with different trap depths due to the non-uniform nature of ZnO nanoparticles or aggregates in the present hybrid devices. Deeper traps have longer charge release time and thus result in slower device response speed.

The photodetector response speed is related to the trap occupancy which depends on the light intensity. At a lower light intensity, the photocurrent decay may be dominated by the slower process of 558 µs because deeper traps are easier to be filled. The response speed at lower light level may be increased by improving the uniformity of ZnO nanoparticles. The photoconductive gain is the ratio between hole recombination time, or device switch-off time, and the transit time that holes sweep through the nanocomposite film to the ITO. The calculated gain of the P3HT:ZnO device from the measured hole mobility and hole recombination time is 3,798.

Figure 13:
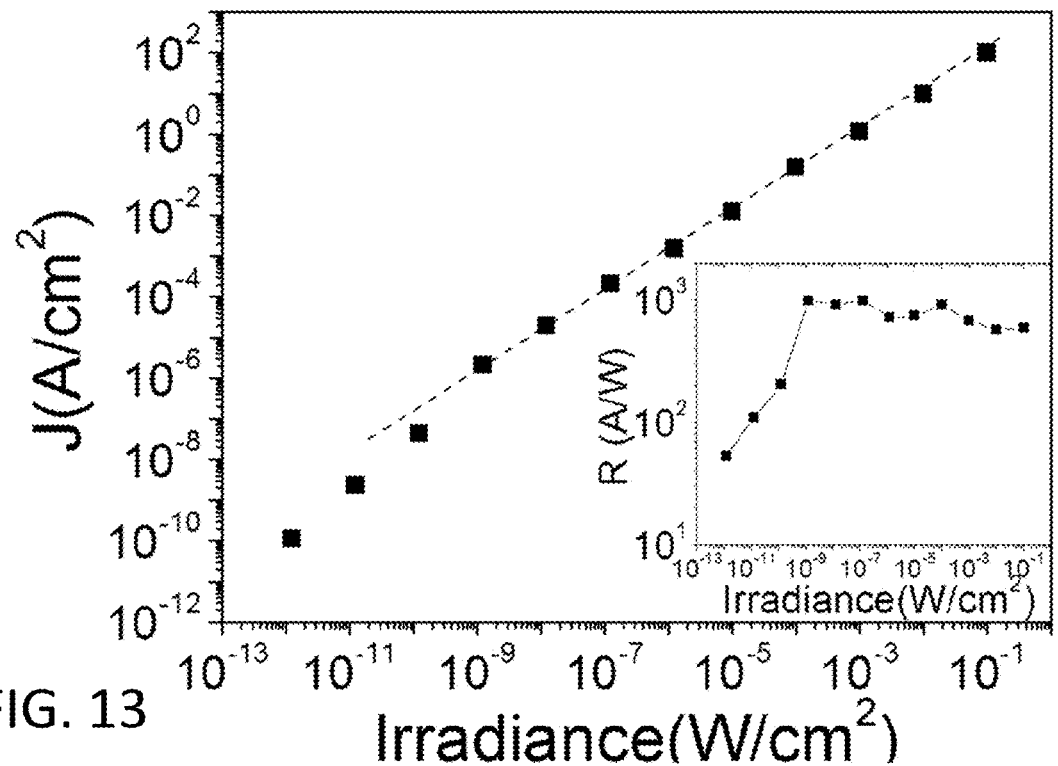
FIG. 13 is a graph showing the dynamic range of a photodetector having a PVK:ZnO active layer. The inset shows responsivities under various illumination intensities.

The photodetector 100 has a large linear dynamic range (LDR) to measure both strong and weak light. The linear dynamic range of the nanocomposite photodetector 100 was characterized by measuring the photocurrent at a fixed frequency of 35 Hz at varied light intensity from $10^{-1}$ W/cm² down to $10^{-12}$ W/cm². As shown in FIG. 13, the PVK:ZnO photodetector shows a linear response within the incident light intensity range from $10^{-1}$ to $10^{-9}$ W/cm², corresponding to an linear dynamic range of 80 dB. The responsivity keeps almost constant in this light intensity range despite a slight (~10%) drop at high light level (inset of FIG. 13). This slight sublinear response at high light intensity is possibly caused by electron trapping saturation and/or limitation of hole mobility in the nanocomposite layers. The device begins to loss its linearity when the incident light intensity is below $10^{-9}$ W/cm². The responsivity drops to 52 A/W and the specific detectivity drops to 2.45×$10^{11}$ Jones accordingly at a light intensity of 1.25×$10^{-12}$ W/cm². The sub-linearity and declined detectivity at low light level is a disadvantage because high gain at low light intensity is desired for weak light detection. However, it can be improved by tuning the morphology of the nanocomposite layer. In principle, we expect a constant responsivity down to the lowest detectable incident light level (NEP) if the automatic transition from the Schottky junction to ohmic contact occurs at such a low incident light level. This is possible because the incident photons can cause a band bending in the local environment surrounding the light-absorbing ZnO nanoparticles which induces strong local hole injection. However, the degree of local band bending varies with the morphology of the nanocomposite layer. If there is aggregation of ZnO nanoparticles, the local average trapped electron density may be reduced and the induced charge injection may be weakened. In addition, there are still many ZnO nanoparticles located in the middle of nanocomposite layer or at the anode side despite the higher ZnO nanoparticles concentration at the cathode side due to the TPD-$Si_2$ interface-induced vertical phase separation. Light absorption by these ZnO nanoparticles far away from the cathode may not induce as much Schottky junction-narrowing effect as those close to the cathode side. This non-ideal morphology may increase the lowest detectable light intensity by the nanocomposite photodetector. It may be possible to reduce the lower limit of detectable light intensity and improve the linear response by pushing more ZnO nanoparticles closer to the cathode side.

Advantages of the photodetector 100 include one or more of the following. The photodetector 100 can be made at a low cost, and the fabrication process can be easily scaled up to a large area. The photodetector 100 has a high gain and a low dark current due to the absence of Ohmic contact in the dark, and can respond quickly.

The following describes exemplary methods for preparing the photodetector. ZnO nanoparticles were prepared using a hydrolysis method in methanol with some modifications. For example, 2.95 g (23 mmol) ZnAc2.2H₂O was dissolved in 125 ml MeOH at 60° C. and followed by dropwise adding KOH solution (1.57 g KOH in 65 ml MeOH) within 5 min. After about 1.5 hour, when the reaction solution became turbid from transparent, the reaction mixture was stirred for one more hour. The nanocrystals were collected by centrifuge and were washed by methanol for three times, and then dispersed in chlorobenzene to form transparent solution.

To fabricate the photodetector, PEDOT:PSS was first spin-cast onto a cleaned ITO glass substrate at a spin speed of 3,000 r.p.m., which gives a PEDOT:PSS film thickness of approximately 30 nm. The PEDOT:PSS was then baked at 120° C. for 30 min before spin-casting the polymer film. Poly vinylcarbazole (PVK) was first dissolved in 1,2-dichlorobenzene to produce a 20 mg ml$^{-1}$ solution, followed by blending with 4,4'-Bis[(p-trichlorosilylpropylphenyl)phenylamino]-biphenyl (TPD-Si$_2$) in a ratio of 1:1 by weight. TPD-Si$_2$ is a cross-linkable, hole-transporting organosiloxane material. The hole-transporting layer was obtained by spin-coating the blend at 4000 r.p.m. for 20 s, and the thickness of the blend film was approximately 70 nm. The film was annealed at 100° C. for 1 hour in air. Due to the plastic effect of TPD-Si$_2$ through thermal annealing, it was stable and has a good resistance to the solvent in the following spin coating process. The active layer was a blend of ZnO with PVK or P3HT in the ratio of 3:1 by weight. It was spin-coated at 1000 r.p.m. for 20 s, then solvent annealed for eight hours. The thickness of the active layer was approximately 550 nm. A 100 nm thick aluminum was thermal evaporated to form the cathode. The active device area was 0.05 cm$^2$.

Electrostatic force microscopy (EFM) was used to characterize the topography and electron trap distribution in the nanocomposite films. The cross-section morphology of the P3HT:ZnO nanoparticle nanocomposite was measured by SEM. The UV light was provided by Newport QE measurement kit which combines a Xe lamp and a monochromator. A Si diode was used to calibrate the light intensity for photocurrent measurement. The external quantum efficiency was measured with the Newport QE measurement kit by focusing a monochromatic beam of light (chopped at 35 Hz, at an optical power density less than or equal to 0.1 mW/cm$^2$) onto the devices. For the transient response measurement, an optical chopper was used to generate the light pulses, a 100K resistor was connected in series with the photodetector, and an oscilloscope (LeCroy WaveRunner) was used to record the voltage variation of the resistor. Batteries were used to bias the device for the measurement of the noise current to minimize noise components from the bias source. The absorption spectra of the photoactive layers PVK:ZnO and P3HT:ZnO were measured with a PerkinElmer Lambda 900 spectrometer. The film thickness was measured with an AMBIOS XP-2 stylus profilometer. Noise current was directly measured with a Lock-In Amplifier SR830.

Figure 14:
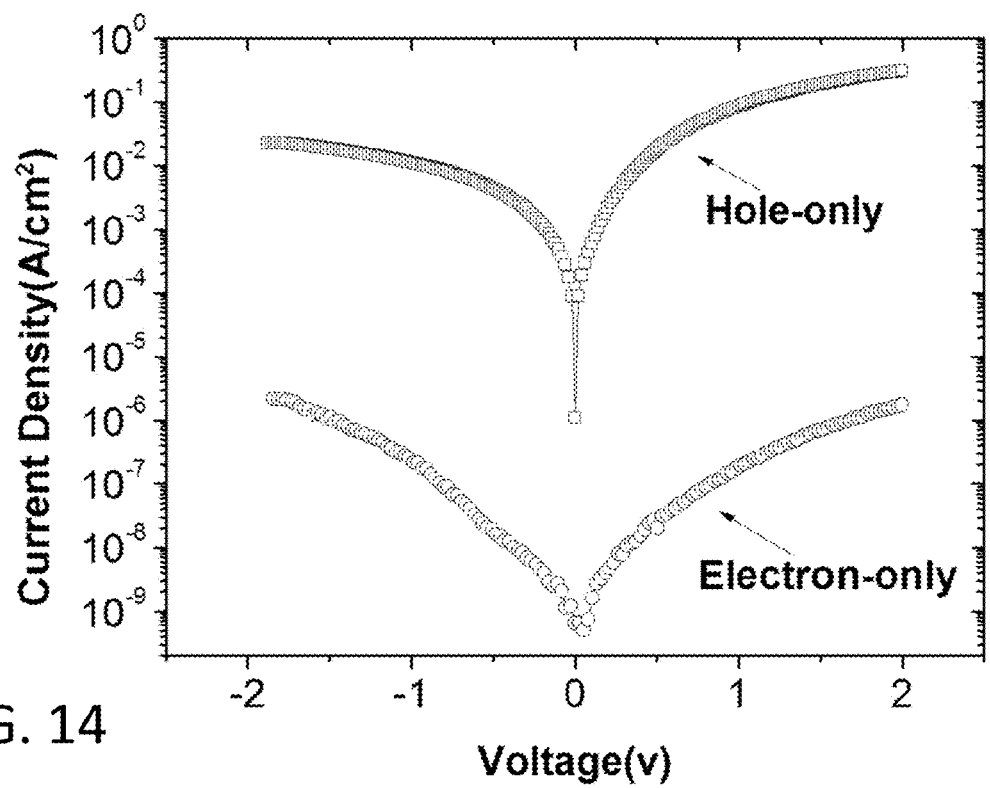
FIG. 14 is a graph showing the current-voltage (I-V) curve under dark conditions for a hole-only device and an electron-only device.

In order to verify the electron trapping in the proposed device, hole-only and electron-only devices were constructed to investigate the type of charge trapping in the photodetectors. The constructed structure is ITO/CsCO$_3$/PVK:ZnO/CsCO$_3$/Al for electron-only and ITO/PEDOT/PVK:ZnO/MnO$_3$/Al for hole-only devices, respectively. FIG. 14 is a graph that shows the current-voltage (I-V) curve under dark conditions.

Figure 15A:
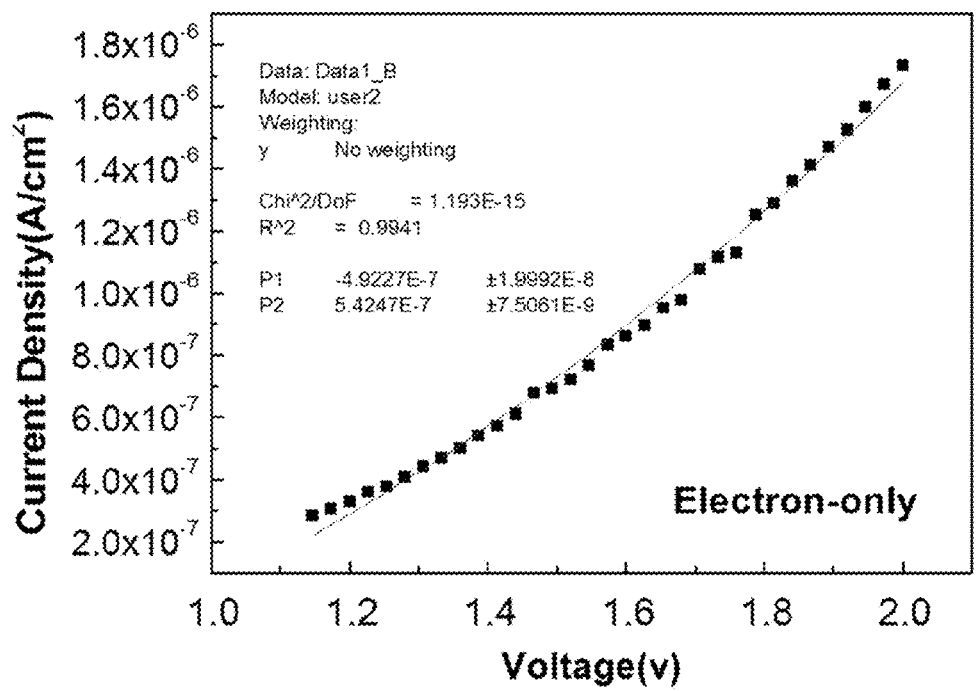
FIG. 15A is a graph showing the J-V curve fitting for the electron-only device.
Figure 15B:
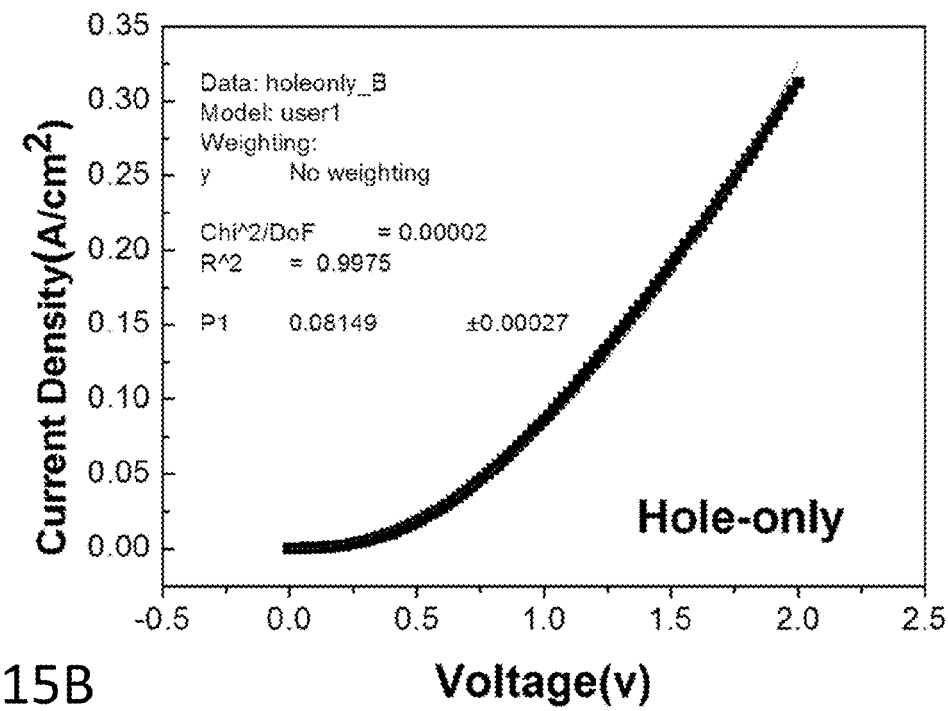
FIG. 15B is a graph showing the J-V curve fitting for the hole-only device.

FIGS. 15A and 15B are graphs showing J-V curve fitting for the electron-only and hole-only devices, respectively. The calculated mobility is 2×10$^{-4}$ cm$^2$/VS for hole and 1.4×10$^{-9}$ cm$^2$/VS for electron. The current density in hole-only device is 4 to 5 orders of magnitude higher than electron-only device. This means electrons can hardly move in the active layer and can be easily trapped by the nanoparticles in the active layer. On the other hand, holes can freely move with a relatively high mobility and thus enables the high photoconductive gain in the photodetector under illumination.

Figure 16:
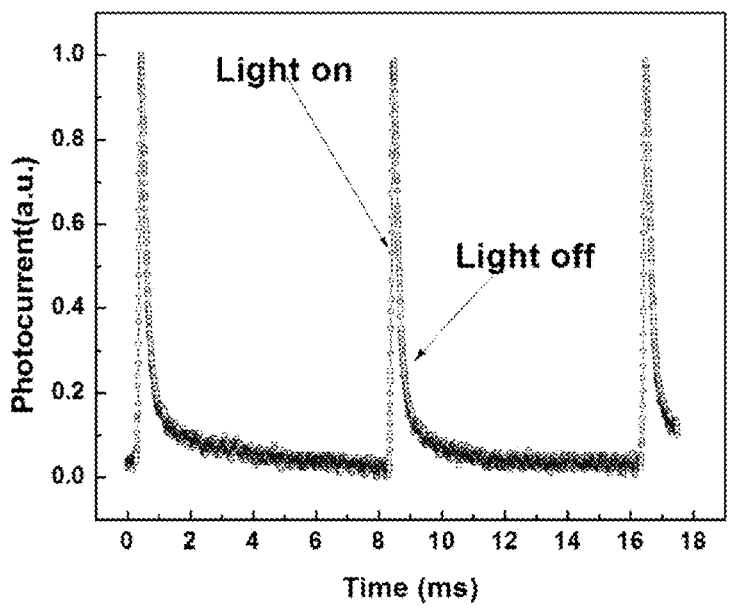
FIG. 16 is a graph showing the transient photo response of a photodetector that uses a P3HT: ZnO active layer.

FIG. 16 is a graph showing the transient photo response of a photodetector that uses a P3HT: ZnO active layer. It has a rise time of about 92 μs (from 10% to 90% of the light intensity level) and a fall time of about 768 μs (from 90% to 10% of the light intensity level), respectively. The RC time constant is 60μ and the chopper open/close time is 12 μs when operating at 125 Hz.

Figure 17:
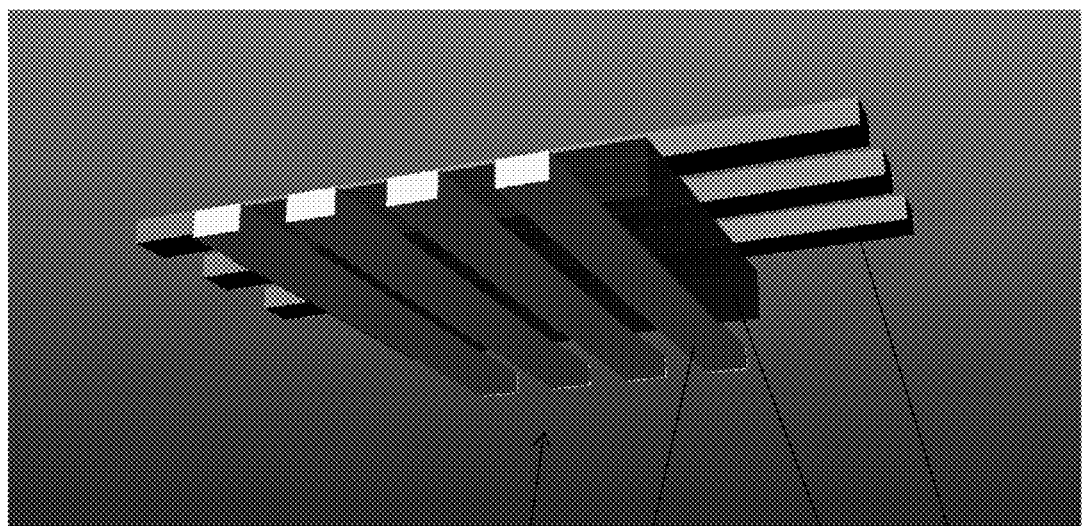
FIG. 17 is a diagram of a photodetector array.

Referring to FIG. 17, in some implementations, a photodetector array 160 includes anode lines 162 that are individually selectable, cathode lines 164 that are individually selectable, and an active layer 166 disposed between the anode lines 162 and the cathode lines 164. The active layer 166 can be similar to the active layer 108 shown in FIG. 1 and includes nanoparticles dispersed in a semiconducting polymer. Each intersection of one of the anode lines 162 and one of the cathode lines 164 form an individually selectable photodetector.

A first buffer layer (not shown) is disposed between the active layer 166 and the anode lines 162, and a second buffer layer (not shown) is disposed between the active layer 166 and the cathode lines 164. The first buffer layer and the second buffer layer can be similar to the first buffer layer 116 and the second buffer layer 118, respectively, of FIG. 1. A controller (not shown) can be configured to receive an address signal and select one of the photodetectors based on the address signal. The controller can apply a bias voltage to the selected photodetector, and measure the current through the selected photodetector to detect light. The amount of current is a function of the level of light. Thus, the photodetector array 160 can be used as an image sensor.

Figure 18:
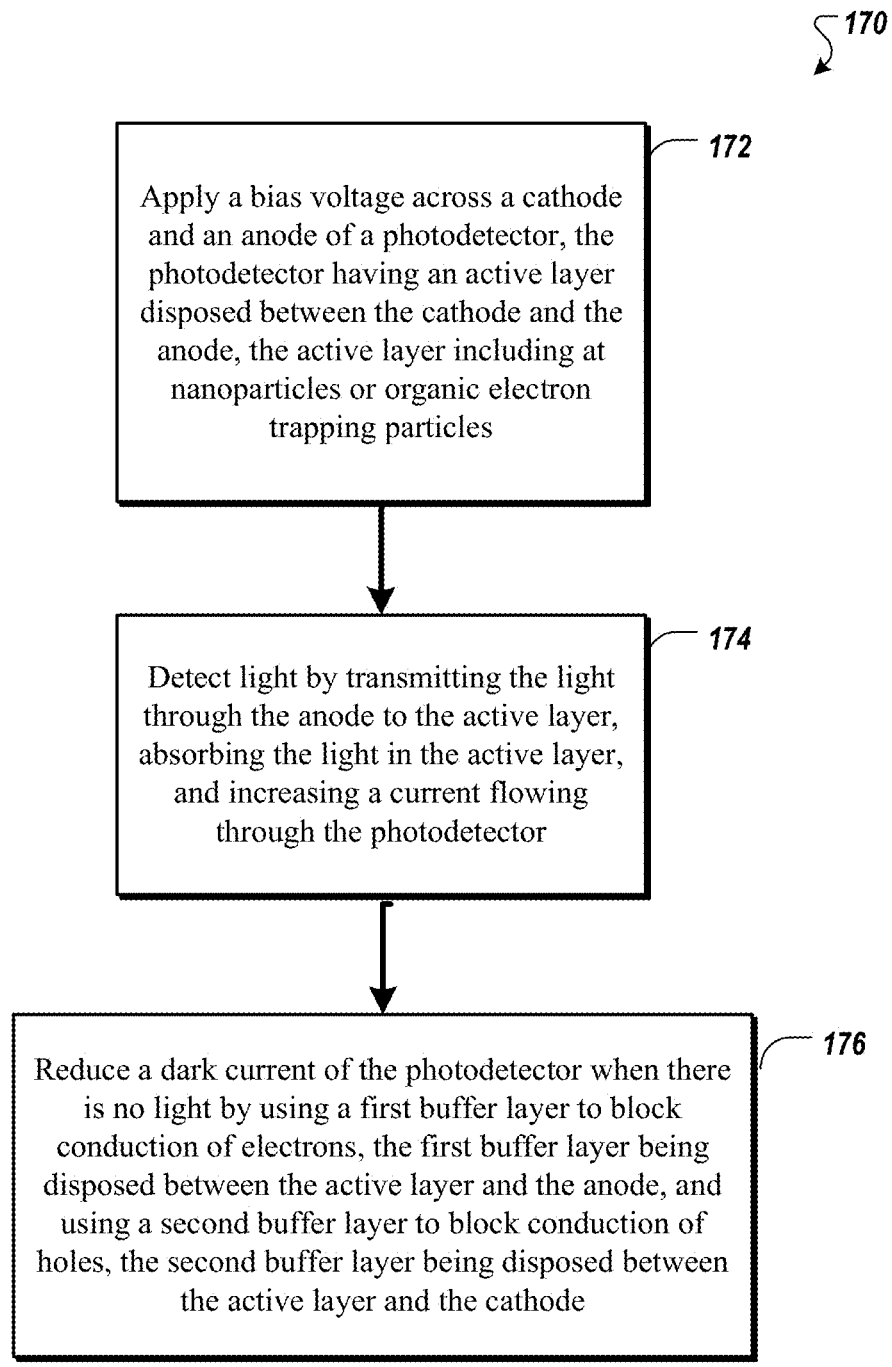
FIG. 18 is a flow diagram of an example process for detecting light.

Referring to FIG. 18, a process 170 for detecting light is provided. For example, the process 170 can be implemented using the photodetector 100 of FIG. 1.

Process 170 includes applying a bias voltage across a cathode and an anode of a photodetector (172), in which the photodetector has an active layer disposed between the cathode and the anode. The active layer includes nanoparticles or organic electron trapping particles.

The process 170 includes detecting light by transmitting the light through the anode to the active layer, absorbing the light in the active layer, and increasing a current flowing through the photodetector (174).

The process 170 includes reducing a dark current of the photodetector when there is no light by using a first buffer layer to block conduction of electrons, the first buffer layer being disposed between the active layer and the anode, and using a second buffer layer to block conduction of holes, the second buffer layer being disposed between the active layer and the cathode (176).

Although some examples have been discussed above, other implementations and applications are also within the scope of the following claims. For example, the thickness of the active layer 108 can be different from those described above. The photodetector can be used to detect light having wavelengths that are different from those described above. The spectrum can be extended to infrared region by using either low bandgap nanoparticles, low bandgap polymer, or both. For example, the nanoparticles can include lead sulfide (PbS) nanoparticles, which absorbs infrared light. A photodetector having an active layer that includes lead sulfide nanoparticles is useful as an infrared light detector.

Figure 19:
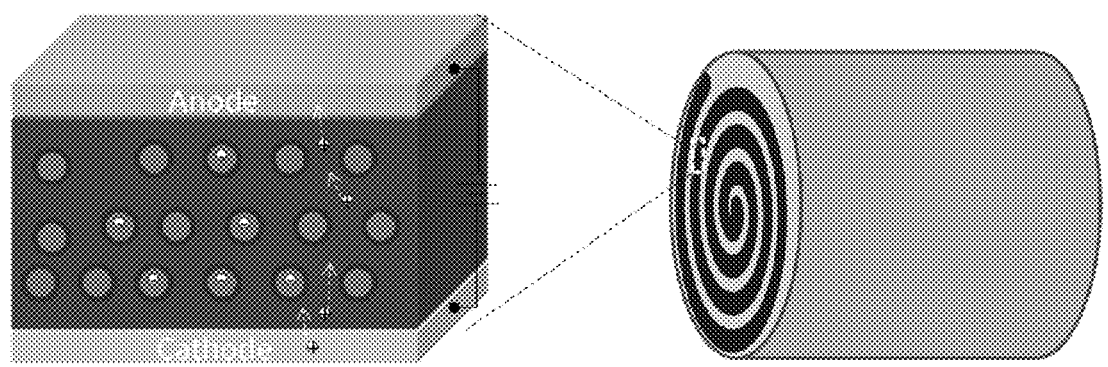
FIG. 19 is a diagram of a detector having a roll-up structure.

The photodetector structure described above can be used to make radiation detectors that detect, e.g., x-rays, gamma rays, and neutrons. A γ-ray or neutron detector can include a nanocomposite material as active layer composed of nanoparticles dispersed in a semiconducting polymer, as shown in FIG. 19. For γ-ray detection, the materials chosen for the nanoparticles can include the family of $Cd_{1-x}Zn_xTe$ (CZT) and its core-shell heterostructures with bandgap greater than 1.8 eV. The stopping power of CZT is about one to two times higher than NaI, four to five times higher than Ge, and 100 times larger than Si for typical gamma-ray energies. For neutron detection, the active layer can include materials such as $B^{10}$ nanoparticles or compound materials containing high weight percentage of $B^{10}$, such as boron carbide and/or boron nitride. Regioregular poly(3-hexylthiophene) (P3HT), which is commercially available, can be used as the polymer because it provides high hole mobilities reaching up to 1 $cm^2V^{-1}s^{-1}$. P3HT:NPs will form a good donor/acceptor pair with a type II heterojunction. A thin layer of aluminum can be used as the cathode and the anode. The thin film photodetector can be fabricated on a flexible plastic foil, and the detector size can be scaled up to be larger than 1" by rolling up flexible detector sheets to form a cylinder shaped detector. This type of detector is low cost because of the low-cost materials used and low-cost solution fabrication method, and also because there is no need for a cooling system or amplifier electronics.

As discussed above, the photodetector includes a transparent electrode, an active layer composed of nanoparticles blended with a semiconducting polymer, buffer layers, and a contact cathode. These components can be made from various materials described below.

For example, the transparent electrode may be made of a material selected from suitable transparent conductors such as, but not limited to, indium tin oxide (ITO), fluorine-doped tin oxide (FTO), aluminum-doped zinc oxide (AZO), antimony-tin mixed oxide (ATO), highly conductivity polymer, networks of metal or carbon nanowire, nanotube, nanosheet or nanorod, carbon nanotube, silver nanowire and graphene. The transparent electrode may be deposited on transparent substrates, such as plastic and/or glass substrates.

For example, the nanoparticles may be selected from, but not limited to, zinc oxide (ZnOx), titanium oxide (TiOx), tin oxide (SnOx), zinc sulfide (ZnS), cadmium sulfide (CdS), lead sulfides (PbS), iron sulfide (FeS), iron pyrite (FeS2); cadmium selenide (CdSe), lead selenide (PbSe), cadmium telluride (CdTe), lead telluride (PbTe), Si, Ge, InAs, InSb, Pb1-xSnxTe, Hg1-xCdxTe, InAsSb, InNSb, InBiTe, InTlSb; or super lattices including: InAs/GaInSb, HgTe/CdTe, carbon nanomaterials (graphene quantum dots, carbon nanotube, fullerene). The nanoparticles can be solution or vacuum deposited particles.

Instead of using nanoparticles, organic electron trapping material (or organic electron acceptor material) may also be used. For example, the electron acceptor material may be selected from, but not limited to, a fullerene and derivatives thereof, a perylene derivative, a 2,7-dicyclohexyl benzo, phenanthroline derivative, a 1,4-diketo-3,6-dithienylpyrrolo[3,4-c]pyrrole (DPP) derivative, a tetracyanoquinodimethane (TCNQ) derivative, indene-C60 bisadduct ([60]ICBA), indene-C70 bisadduct ([70]ICBA), a poly(p-pyridyl vinylene) (PPyV) derivative, a 9,9'-bifluorenylidene (99BF) derivative, a benzothiadiazole (BT) derivative, and combinations thereof, [6,6]-phenyl C61-butyric acid methyl ester (PCBM), [6,6]-phenyl C61-butyric acid methyl ester (PC70BM), [6,6]-(4-fluoro-phenyl)-C61-butyric acid methyl ester (FPCBM), carbon 60 (C60), carbon 70 (C70), carbon nanotube (CNT), a carbon onion, and combinations thereof.

For example, the semiconducting polymers may be selected from electron donor materials such as, but not limited to, polyvinylcarbazole (PVK), poly(3-hexylthiophene) (P3HT), poly[4,8-bis-(2-ethyl-hexyl-thiophene-5-yl)-benzo[1,2-b:4,5-b'] dithiophene-2,6-diyl]-alt-[2-(2'-ethyl-hexanoyl)-thieno[3,4-b]thiophen-4,6-diyl (PBDTTT-CT), phthalocyanine complex, a porphyrin complex, a polythiophene (PT) and derivatives thereof, a polycarbazole and derivatives thereof, a poly(p-phenylene vinylene) (PPV) and derivatives thereof, a polyfluorene (PF) and derivatives thereof, a cyclopentadithiophene-based polymer, a benzodithiophene (BDT)-based polymer, and combinations thereof, polythiophenes and derivatives thereof, polycarbazoles and derivatives, poly(3-octylthiophene) (P3OT), poly(3-hexyloxythiophene) (P3DOT), poly(3-methylthiophene) (PMeT), poly(3-dodecylthiophene) (P3DDT), poly(3-dodecylthienylenevinylene) (PDDTV), poly(3,3 dialkylquarterthiophene) (PQT), poly-dioctyl-fluorene-co-bithiophene (F8T2), poly-(2,5,-bis(3-alkylthiophene-2-yl)thieno[3,2-b]thiophene) (PBTTT-C12), poly[2,7-(9,9'-dihexylfluorene)-alt-2,3-dimethyl-5,7-dithien-2-yl-2,1,3-benzothiadiazole] (PFDDTBT), poly {[2,7-(9,9-bis-(2-ethylhexyl)-fluorene)]-alt-[5,5-(4,7-di-20-thienyl-2,1,3-benzothiadiazole)]} (BisEH-PFDTBT), poly {[2,7-(9,9-bis-(3,7-dimethyl-octyl)-fluorene)]-alt-[5,5-(4,7-di-20-thienyl-2,1,3-benzothiadiazole)]} (BisDMO-PFDTBT), poly[N-9"'-hepta-decanyl-2,7-carbazole-alt-5,5-(4',7'-di-2-thienyl-2',1',3'-benzothiadiazole)] (PCDTBT), and combinations thereof.

For example, the cathode contact material may be selected from, but not limited to aluminum, calcium, magnesium, lithium, sodium, potassium, strontium, cesium, barium, iron, cobalt, nickel, copper, silver, zinc, tin, samarium, ytterbium, chromium, gold, graphene, an alkali metal fluoride, an alkaline-earth metal fluoride, an alkali metal chloride, an alkaline-earth metal chloride, an alkali metal oxide, an alkaline-earth metal oxide, a metal carbonate, a metal acetate, or combinations thereof. The cathode contact material may be solution or vacuum deposited thin films.

Buffer layers, both at the anode and at the cathode interface, mainly to favor charge collection, extraction or blocking, can improve the device's overall performance.

For example, the anode buffer layer may use a material selected from organic materials, self-assembled monolayers (SAMs), or inorganic materials, such as, but not limited to poly(3,4-ethylenedioxithiophene) (PEDOT) doped with poly(styrene sulfonicacid) (PSS), 4,4'-bis[(ptrichlorosilylpropylphenyl)phenylamino]biphenyl (TPD-Si2), poly(3-hexyl-2,5-thienylene vinylene) (P3HTV) and C60, copper phthalocyanine (CuPc), poly[3,4-(1hydroxymethyl)ethylenedioxythiophene] (PHEDOT), n-dodecylbenzenesulfonic acid/hydrochloric acid-doped poly(aniline) nanotubes (a-PANIN)s, poly(styrenesulfonic acid)-graft-poly(aniline) (PSSA-g-PANI), poly[(9,9-dioctylfluorene)-co-N-(4-(1-methylpropyl)phenyl)diphenylamine] (PFT), 4,4'-bis[(p-trichlorosilylpropylphenyl) phenylamino]biphenyl (TSPP), 5,5'-bis[(p-trichlorosilylpropylphenyl) phenylamino]-2,20-bithiophene (TSPT), N-propyltriethoxysilane, 3,3,3-trifluoropropyltrichlorosilane or 3-aminopropyltriethoxysilane, $V_2O_5$, VOx, $MoO_3$, $WO_3$, $ReO_3$, NiOx, AgOx/PEDOT:PSS, $Cu_2O$, CuSCN/P3HT, or Au nanoparticles.

The cathode buffer layer may use a material selected from alkali metal compounds, metal oxide, organic materials, self-assembled monolayers (SAMs), or inorganic materials, such as, but not limited to, LiF, CsF, $LiCoO_2$, $Cs_2CO_3$, TiOx, $TiO_2$ nanorods (NRs), ZnO, ZnO nanorods (NRs), ZnO nanoparticles (NPs), ZnO, $Al_2O_3$, CaO, bathocuproine (BCP), copper phthalocyanine (CuPc), pentacene, pyronin B, pentadecafluorooctyl phenyl-C60-butyrate (F—PCBM), C60, C60/LiF, ZnO NRs/PCBM, ZnO/cross-linked fullerene derivative (C-PCBSD), single walled carbon nanotubes (SWCNT), poly(ethylene glycol) (PEG), poly(dimethylsiloxane-block-methyl methacrylate) (PDMS-b-PMMA), polar polyfluorene (PF-EP), polyfluorene bearing lateral amino groups (PFN), polyfluorene bearing quaternary ammonium groups in the side chains (WPF-oxy-F), polyfluorene bearing quaternary ammonium groups in the side chains (WPF-6-oxy-F), fluorene alternating and random copolymer bearing cationic groups in the alkyl side chains (PFNBr-DBT15), fluorene alternating and random copolymer bearing cationic groups in the alkyl side chains (PFP-NBr), or poly(ethylene oxide) (PEO).

What is claimed is:

1. An apparatus comprising:
   a photodetector comprising:
      an anode;
      a cathode;
      an active layer disposed between the anode and the cathode, the active layer comprising nanoparticles that trap electrons,
         wherein the nanoparticles comprise at least one of zinc oxide (ZnOx), titanium oxide (TiOx), tin oxide (SnOx), zinc sulfide (ZnS), iron sulfide (FeS), iron pyrite (FeS2), Ge, InAs, InSb, $Pb_{1-x}Sn_xTe$, $Hg_{1-x}Cd_xTe$ ($0 \leq x < 1$), InAsSb, InNSb, InBiTe, or InTlSb;
      a first buffer layer disposed between the active layer and the anode; and
      a second buffer layer disposed between the active layer and the cathode, in which the first buffer layer blocks conduction of electrons and the second buffer layer blocks conduction of holes to reduce a dark current through the photodetector when the photodetector is not illuminated by light.

2. The photodetector of claim 1 in which the nanoparticles further comprise at least one of InAs/GaInSb super lattice, HgTe/CdTe super lattice, graphene quantum dots, carbon nanotube, or fullerene.

3. The apparatus of claim 1 in which the active layer comprises a polymer.

4. The apparatus of claim 1 in which the active layer comprises at least one of polyvinylcarbazole (PVK), poly (3-hexylthiophene) (P3HT), poly[4,8-bis-(2-ethyl-hexyl-thiophene-5-yl)-benzo[1,2-b:4,5-b'] dithiophene-2,6-diyl]-alt-[2-(2'-ethyl-hexanoyl)-thieno [3,4-b]thiophen-4,6-diyl (PBDTTT-CT), phthalocyanine complex, a porphyrin complex, a polythiophene (PT), a derivative of polythiophene, a polycarbazole, a derivative of polycarbazole, a poly(p-phenylene vinylene) (PPV), a derivative of poly(p-phenylene vinylene), a polyfluorene (PF), a derivative of polyfluorene, a cyclopentadithiophene-based polymer, a benzodithiophene (BDT)-based polymer, a polythiophene, a derivative of polythiophene, a polycarbazole, a derivative of polycarbazole, poly(3-octylthiophene) (P3OT), poly(3-hexyloxythiophene) (P3DOT), poly(3-methylthiophene) (PMeT), poly(3-dodecylthiophene) (P3DDT), poly(3-dodecylthienylenevinylene) (PDDTV), poly(3,3 dialkylquarterthiophene) (PQT), poly-dioctyl-fluorene-co-bithiophene (F8T2), poly-(2,5,-bis(3-alkylthiophene-2-yl) thieno[3,2-b']thiophene) (PBTTT-C12), poly[2,7-(9,9'-di-hexylfluorene)-alt-2,3-dimethyl-5,7-dithien-2-yl-2,1,3-benzothiadiazole] (PFDDTBT), poly{[2,7-(9,9-bis-(2-ethylhexyl)-fluorene)]-alt-[5,5-(4,7-di-20-thienyl-2,1,3-benzothiadiazole)]} (BisEH-PFDTBT), poly{[2,7-(9,9-bis-(3,7-dimethyl-octyl)-fluorene)]-alt-[5,5-(4,7-di-thienyl-2,1,3-benzothiadiazole)]} (BisDMO-PFDTBT), poly[N-9"-hepta-decanyl-2,7-carbazole-alt-5,5-(4',7'-di-2-thienyl-2',1', 3'-benzothiadiazole)] (PCDTBT), or a combination of two or more of the above materials.

5. The apparatus of claim 1 in which the anode comprises at least one of indium tin oxide (ITO), fluorine-doped tin oxide (FTO), aluminum-doped zinc oxide (AZO), antimony-tin mixed oxide (ATO), a conductive polymer, a network of metal nanowire, a network of carbon nanowire, nanotube, nanosheet, nanorod, carbon nanotube, silver nanowire, or graphene.

6. The apparatus of claim 1 in which the cathode comprises at least one of aluminum, calcium, magnesium, lithium, sodium, potassium, strontium, cesium, barium, iron, cobalt, nickel, copper, silver, zinc, tin, samarium, ytterbium, chromium, gold, graphene, an alkali metal fluoride, an alkaline-earth metal fluoride, an alkali metal chloride, an alkaline-earth metal chloride, an alkali metal oxide, an alkaline-earth metal oxide, a metal carbonate, a metal acetate, or a combination of two or more of the above materials.

7. The apparatus of claim 1 in which the first buffer layer comprises at least one of an organic materials or self-assembled monolayers (SAMs).

8. The apparatus of claim 1 in which the first buffer layer comprises at least one of poly(3,4-ethylenedioxythiophene) (PEDOT) doped with poly(styrene sulfonicacid) (PSS), 4,4'-bis[(ptrichlorosilylpropylphenyl)phenylamino]biphenyl (TPD-Si2), poly(3-hexyl-2,5-thienylene vinylene) (P3HTV) and C60, copper phthalocyanine (CuPc), poly[3,4-(1hydroxymethyl) ethylenedioxythiophene] (PHEDOT), n-dodecylbenzenesulfonic acid/hydrochloric acid-doped poly(aniline) nanotubes (a-PANIN)s, poly(styrenesulfonic acid)-graft-poly(aniline) (PSSA-g-PANI), poly[(9,9-dioctylfluorene)-co-N-(4-(1-methylpropyl)phenyl) diphenylamine] (PFT), 4,4'-bis[(p-trichlorosilylpropylphenyl) phenylamino]biphenyl (TSPP), 5,5'-bis[(p-trichlorosilylpropylphenyl) phenylamino]-2,20-bithiophene (TSPT), N-propyltriethoxysilane, 3,3,3-trifluoropropyltrichlorosilane or 3-aminopropyltriethoxysilane, $V_2O_5$, VOx, $MoO_3$, $WO_3$, $ReO_3$, NiOx, AgOx/PEDOT:PSS, $Cu_2O$, CuSCN/P3HT, or Au nanoparticles.

9. The apparatus of claim 1 in which the second buffer layer comprises at least one of an alkali metal compound, a metal oxide, an organic material, or self-assembled monolayers (SAMs).

10. The apparatus of claim 1 in which the second buffer layer comprises at least one of LiF, CsF, $LiCoO_2$, $Cs_2CO_3$, TiOx, $TiO_2$ nanorods (NRs), ZnO, ZnO nanorods (NRs), ZnO nanoparticles (NPs), ZnO, $Al_2O_3$, CaO, bathocuproine (BCP), copper phthalocyanine (CuPc), pentacene, pyronin B, pentadecafluorooctyl phenyl-C60-butyrate (F-PCBM), C60, C60/LiF, ZnO NRs/PCBM, ZnO/cross-linked fullerene derivative (C-PCBSD), single walled carbon nanotubes (SWCNT), poly(ethylene glycol) (PEG), poly(dimethylsiloxane-block-methyl methacrylate) (PDMS-b-PMMA), polar polyfluorene (PF-EP), polyfluorene bearing lateral amino groups (PFN), polyfluorene bearing quaternary ammonium groups in the side chains (WPF-oxy-F), polyfluorene bearing quaternary ammonium groups in the side chains (WPF-6-oxy-F), fluorene alternating and random copolymer bearing cationic groups in the alkyl side chains (PFNBr-DBT15), fluorene alternating and random copolymer bearing cationic groups in the alkyl side chains (PFP-NBr), or poly(ethylene oxide) (PEO).

11. The apparatus of claim 1 in which the active layer absorbs light having a wavelength in a first predetermined range.

12. The apparatus of claim 11 in which the anode is transparent or partially transparent to light having a wavelength in a second predetermined range, the second predetermined range overlapping the first predetermined range in a third predetermined range.

13. The apparatus of claim 12 in which the photodetector has a high resistivity when not illuminated by light and has a low resistivity when illuminated by light having a wavelength in the third predetermined range.

14. An apparatus comprising:
a photodetector array comprising:
a plurality of anode lines that are individually selectable;
a plurality of cathode lines that are individually selectable; and
an active layer disposed between the anode lines and cathode lines, the active layer comprising nanoparticles that trap electrons, in which each intersection of one of the anode lines and one of the cathode lines form an individually selectable photodetector, wherein the nanoparticles comprise at least one of zinc oxide (ZnOx), titanium oxide (TiOx), tin oxide (SnOx), zinc sulfide (ZnS), iron sulfide (FeS), iron pyrite (FeS2), Ge, InAs, InSb, $Pb_{1-x}Sn_xTe$, $Hg_{1-x}Cd_xTe$ ($0 \leq x < 1$), InAsSb, InNSb, InBiTe, or InTlSb.

15. The apparatus of claim 14, comprising:
a first buffer layer disposed between the active layer and the anode lines; and
a second buffer layer disposed between the active layer and the cathode lines, the first buffer layer having a higher hole conductivity compared to that of the second buffer layer, the second buffer layer having a higher electron conductivity compared to that of the first buffer layer.

16. The apparatus of claim 14, comprising a controller configured to receive an address signal and select one of the photodetectors based on the address signal.

17. The photodetector array of claim 14 in which the nanoparticles comprise at least one of InAs/GaInSb super lattice, HgTe/CdTe super lattice, graphene quantum dots, carbon nanotube, or fullerene.

18. The apparatus of claim 14 in which the active layer absorbs light having a wavelength in a first predetermined range.

19. The apparatus of claim 14 in which the anode lines are transparent or partially transparent to light having a wavelength in a second predetermined range, the second predetermined range overlapping the first predetermined range in a third predetermined range.

20. The apparatus of claim 14 in which each photodetector has a high resistivity when not illuminated by light and has a low resistivity when illuminated by light having a wavelength in the third predetermined range.

21. An apparatus comprising:
a photodetector comprising:
an anode that is transparent or partially transparent to light having a wavelength in a first predetermined range;
a cathode; and
an active layer disposed between the anode and the cathode, in which the active layer comprises nanoparticles that trap electrons, and the active layer absorbs light having a wavelength in a second predetermined range, the second predetermined range overlapping the first predetermined range in a third predetermined range,
wherein the nanoparticles comprise at least one of zinc oxide (ZnOx), titanium oxide (TiOx), tin oxide (SnOx), zinc sulfide (ZnS), iron sulfide (FeS), iron pyrite (FeS2), Ge, InAs, InSb, $Pb_{1-x}Sn_xTe$, $Hg_{1-x}Cd_xTe$ ($0 \leq x < 1$), InAsSb, InNSb, InBiTe, or InTlSb;
wherein the photodetector has a high resistivity when not illuminated by light and has a low resistivity when illuminated by light having a wavelength in the third predetermined range.

22. The apparatus of claim 21, comprising
a first buffer layer disposed between the active layer and the anode; and
a second buffer layer disposed between the active layer and the cathode, the first buffer layer having a higher hole conductivity compared to that of the second buffer layer, the second buffer layer having a higher electron conductivity compared to that of the first buffer layer.

23. The apparatus of claim 22 in which the first buffer layer comprises at least one of an organic materials or self-assembled monolayers (SAMs).

24. The apparatus of claim 22 in which the first buffer layer comprises at least one of poly(3,4-ethylenedioxithiophene) (PEDOT) doped with poly(styrene sulfonicacid) (PSS), 4,4'-bis[(ptrichlorosilylpropylphenyl)phenylamino] biphenyl (TPD-Si2), poly(3-hexyl-2,5-thienylene vinylene) (P3HTV) and C60, copper phthalocyanine (CuPc), poly[3,4-(1hydroxymethyl) ethylenedioxythiophene] (PHEDOT), n-dodecylbenzenesulfonic acid/hydrochloric acid-doped poly(aniline) nanotubes (a-PANIN)s, poly(styrenesulfonic acid)-graft-poly(aniline) (PSSA-g-PANI), poly[(9,9-dioctylfluorene)-co-N-(4-(1-methylpropyl)phenyl)diphenylamine] (PFT), 4,4'-bis[(p-trichlorosilylpropylphenyl) phenylamino] biphenyl (TSPP), 5,5'-bis[(p-trichlorosilylpropylphenyl) phenylamino]-2,20-bithiophene (TSPT), N-propyltriethoxysilane, 3,3,3-trifluoropropyltrichlorosilane or 3-aminopropyltriethoxysilane, $V_2O_5$, VOx, $MoO_3$, $WO_3$, $ReO_3$, NiOx, AgOx/PEDOT:PSS, $Cu_2O$, CuSCN/P3HT, or Au nanoparticles.

25. The apparatus of claim 22 in which the second buffer layer comprises at least one of an alkali metal compound, a metal oxide, an organic material, or self-assembled monolayers (SAMs).

26. The apparatus of claim 22 in which the second buffer layer comprises at least one of LiF, CsF, $LiCoO_2$, $Cs_2CO_3$, TiOx, $TiO_2$ nanorods (NRs), ZnO, ZnO nanorods (NRs), ZnO nanoparticles (NPs), ZnO, $Al_2O_3$, CaO, bathocuproine (BCP), copper phthalocyanine (CuPc), pentacene, pyronin B, pentadecafluorooctyl phenyl-C60-butyrate (F-PCBM), C60, C60/LiF, ZnO NRs/PCBM, ZnO/cross-linked fullerene derivative (C-PCBSD), single walled carbon nanotubes (SWCNT), poly(ethylene glycol) (PEG), poly(dimethylsiloxane-block-methyl methacrylate) (PDMS-b-PMMA), polar polyfluorene (PF-EP), polyfluorene bearing lateral amino groups (PFN), polyfluorene bearing quaternary ammonium groups in the side chains (WPF-oxy-F), polyfluorene bearing quaternary ammonium groups in the side chains (WPF-6-oxy-F), fluorene alternating and random copolymer bearing cationic groups in the alkyl side chains (PFNBr-DBT15), fluorene alternating and random copolymer bearing cationic groups in the alkyl side chains (PFP-NBr), or poly(ethylene oxide) (PEO).

27. The photodetector of claim 21 in which the nanoparticles further comprise at least one of InAs/GaInSb super lattice, HgTe/CdTe super lattice, graphene quantum dots, carbon nanotube, or fullerene.

28. The apparatus of claim 21 in which the active layer comprises a polymer.

29. The apparatus of claim 21 in which the active layer comprises at least one of polyvinylcarbazole (PVK), poly (3-hexylthiophene) (P3HT), poly[4,8-bis-(2-ethyl-hexyl-thiophene-5-yl)-benzo[1,2-b:4,5-b'] dithiophene-2,6-diyl]-alt-[2-(2'-ethyl-hexanoyl)-thieno [3,4-b]thiophen-4,6-diyl (PBDTTT-CT), phthalocyanine complex, a porphyrin complex, a polythiophene (PT), a derivative of polythiophene, a polycarbazole, a derivative of polycarbazole, a poly(p-phenylene vinylene) (PPV), a derivative of poly(p-phenylene vinylene), a polyfluorene (PF), a derivative of polyfluorene, a cyclopentadithiophene-based polymer, a benzodithiophene (BDT)-based polymer, a polythiophene, a derivative of polythiophene, a polycarbazole, a derivative of polycarbazole, poly(3-octylthiophene) (P3OT), poly(3-hexyloxythiophene) (P3DOT), poly(3-methylthiophene) (PMeT), poly(3-dodecylthiophene) (P3DDT), poly(3-dodecylthienylenevinylene) (PDDTV), poly(3,3 dialkylquarterthiophene) (PQT), poly-dioctyl-fluorene-co-bithiophene (F8T2), poly-(2,5,-bis(3-alkylthiophene-2-yl) thieno[3,2-b]thiophene) (PBTTT-C12), poly[2,7-(9,9'-di-hexylfluorene)-alt-2,3-dimethyl-5,7-dithien-2-yl-2,1,3-benzothiadiazole] (PFDDTBT), poly{[2,7-(9,9-bis-(2-ethylhexyl)-fluorene)]-alt-[5,5-(4,7-di-20-thienyl-2,1,3-benzothiadiazole)]} (BisEH-PFDTBT), poly{[2,7-(9,9-bis-(3,7-dimethyl-octyl)-fluorene)]-alt-[5,5-(4,7-di-20-thienyl-2,1,3-benzothiadiazole)]} (BisDMO-PFDTBT), poly[N-9"-hepta-decanyl-2,7-carbazole-alt-5,5-(4',7'-di-2-thienyl-2',1', 3'-benzothiadiazole)] (PCDTBT), or a combination of two or more of the above materials.

30. The apparatus of claim 21 in which the anode comprises at least one of indium tin oxide (ITO), fluorine-doped tin oxide (FTO), aluminum-doped zinc oxide (AZO), antimony-tin mixed oxide (ATO), a conductive polymer, a network of metal nanowire, a network of carbon nanowire, nanotube, nanosheet, nanorod, carbon nanotube, silver nanowire, or graphene.

31. The apparatus of claim 21 in which the cathode comprises at least one of aluminum, calcium, magnesium, lithium, sodium, potassium, strontium, cesium, barium, iron, cobalt, nickel, copper, silver, zinc, tin, samarium, ytterbium, chromium, gold, graphene, an alkali metal fluoride, an alkaline-earth metal fluoride, an alkali metal chloride, an alkaline-earth metal chloride, an alkali metal oxide, an alkaline-earth metal oxide, a metal carbonate, a metal acetate, or a combination of two or more of the above materials.

32. A method comprising:
applying a bias voltage across a cathode and an anode of a photodetector, the photodetector having an active layer disposed between the cathode and the anode, the active layer comprising nanoparticles,
wherein the nanoparticles comprise at least one of zinc oxide (ZnOx), titanium oxide (TiOx), tin oxide (SnOx), zinc sulfide (ZnS), iron pyrite (FeS), iron pyrite (FeS2), Ge, InAs, InSb, $Pb_{1-x}Sn_xTe$, $Hg_{1-x}Cd_xTe$ ($0 \le x < 1$), InAsSb, InNSb, InBiTe, or InTlSb; and
detecting light by transmitting the light through the anode to the active layer, absorbing the light in the active layer, and increasing a current flowing through the photodetector.

33. The method of claim 32, comprising reducing a dark current of the photodetector when there is no light by using a first buffer layer to block conduction of electrons, the first buffer layer being disposed between the active layer and the anode, and using a second buffer layer to block conduction of holes, the second buffer layer being disposed between the active layer and the cathode.

34. The method of claim 32, comprising upon absorbing light at the active layer, producing electrons and holes from an interaction of the light and materials in the active layer, and trapping the electrons using the nanoparticles.

35. A method comprising:
applying a bias voltage across a cathode and an anode of a photodetector, the photodetector having an active layer disposed between the cathode and the anode, the active layer comprising nanoparticles,
wherein the nanoparticles comprise at least one of zinc oxide (ZnOx), titanium oxide (TiOx), tin oxide (SnOx), zinc sulfide (ZnS), iron sulfide (FeS), iron pyrite (FeS2), Ge, InAs, InSb, $Pb_{1-x}Sn_xTe$, $Hg_{1-x}Cd_xTe$ ($0 \le x < 1$), InAsSb, InNSb, InBiTe, or InTlSb;
when the photodetector is not illuminated by light, operating the photodetector in a first mode comparable to a photodiode having a rectifying Schottky contact; and
when the photodetector is illuminated by light, operating the photodetector in a second mode comparable to a photoconductor having an Ohmic contact.

36. The method of claim 35, comprising, when the photodetector is illuminated by light, transmitting the light through the anode to the active layer, absorbing the light in the active layer, and increasing a current flowing through the photodetector.

37. The method of claim 35, comprising, when the photodetector is not illuminated by light, reducing a dark current of the photodetector by using a first buffer layer to block conduction of electrons, the first buffer layer being disposed between the active layer and the anode, and using a second buffer layer to block conduction of holes, the second buffer layer being disposed between the active layer and the cathode.

38. The apparatus of claim 1, further comprising a voltage source to provide a bias voltage across the anode and the cathode of the photodetector.

39. The apparatus of claim 14, further comprising a voltage source to provide a bias voltage across a selected one of the anode lines and a selected one of the cathode lines of the photodetector array.

40. The apparatus of claim 21, further comprising a voltage source to provide a bias voltage across the anode and the cathode of the photodetector.

41. An apparatus comprising:
a photodetector comprising:
an anode;
a cathode;
an active layer disposed between the anode and the cathode, the active layer comprising electron trapping particles;
a first buffer layer disposed between the active layer and the anode, the first buffer layer comprises at least one of 4,4'-bis[(ptrichlorosilylpropylphenyl)phenylamino]biphenyl (TPD-Si2), poly(3-hexyl-2,5-thienylene vinylene) (P3HTV) and C60, copper phthalocyanine (CuPc), poly[3,4-(1hydroxymethyl) ethylenedioxythiophene] (PHEDOT), n-dodecylbenzenesulfonic acid/hydrochloric acid-doped poly(aniline) nanotubes (a-PANIN)s, poly(styrenesulfonic acid)-graft-poly(aniline) (PSSA-g-PANI), poly[(9,9-dioctylfluorene)-co-N-(4-(1-methylpropyl)phenyl) diphenylamine] (PFT), 4,4'-bis[(p-trichlorosilylpropylphenyl) phenylamino]biphenyl (TSPP), 5,5'-bis [(p-trichlorosilylpropylphenyl) phenylamino]-2,20- bithiophene (TSPT), N-propyltriethoxysilane, 3,3,3-trifluoropropyltrichlorosilane or 3-aminopropyltriethoxysilane, $V_2O_5$, VOx, $MoO_3$, $WO_3$, $ReO_3$, NiOx, $Cu_2O$, CuSCN/P3HT, or Au nanoparticles; and a second buffer layer disposed between the active layer and the cathode, in which the first buffer layer blocks conduction of electrons and the second buffer layer blocks conduction of holes to reduce a dark current through the photodetector when the photodetector is not illuminated by light.

42. The apparatus of claim 41 in which the active layer of the photodetector comprises nanoparticles that trap electrons.

43. The apparatus of claim 41, further comprising a voltage source to provide a bias voltage across the anode and the cathode of the photodetector.

44. The apparatus of claim 41 in which the nanoparticles comprise at least one of zinc oxide (ZnOx), titanium oxide (TiOx), tin oxide (SnOx), zinc sulfide (ZnS), iron sulfide (FeS), iron pyrite (FeS2), Ge, InAs, InSb, $Pb_{1-x}Sn_xTe$, $Hg_{1-x}Cd_xTe$, InAsSb, InNSb, InBiTe, or InTlSb.

45. An apparatus comprising:
a photodetector comprising:
an anode;
a cathode;
an active layer disposed between the anode and the cathode, the active layer comprising electron trapping particles;
a first buffer layer disposed between the active layer and the anode; and
a second buffer layer disposed between the active layer and the cathode, in which the first buffer layer blocks conduction of electrons and the second buffer layer blocks conduction of holes to reduce a dark current through the photodetector when the photodetector is not illuminated by light, wherein the second buffer layer comprises at least one of LiF, $LiCoO_2$, TiOx, $TiO_2$ nanorods (NRs), ZnO, ZnO nanorods (NRs), ZnO nanoparticles (NPs), ZnO, $Al_2O_3$, CaO, bathocuproine (BCP), copper phthalocyanine (CuPc), pentacene, pyronin B, pentadecafluorooctyl phenyl-C60-butyrate (F-PCBM), C60, C60/LiF, ZnO NRs/PCBM, ZnO/cross-linked fullerene derivative (C-PCBSD), single walled carbon nanotubes (SW-CNT), poly(ethylene glycol) (PEG), poly(dimethylsiloxane-block-methyl methacrylate) (PDMS-b-PMMA), polar polyfluorene (PF-EP), polyfluorene bearing lateral amino groups (PFN), polyfluorene bearing quaternary ammonium groups in the side chains (WPF-oxy-F), polyfluorene bearing quaternary ammonium groups in the side chains (WPF-6-oxy-F), fluorene alternating and random copolymer bearing cationic groups in the alkyl side chains (PFNBr-DBT15), fluorene alternating and random copolymer bearing cationic groups in the alkyl side chains (PFPNBr), or poly(ethylene oxide) (PEO).

46. The apparatus of claim 45 in which the active layer of the photodetector comprises nanoparticles that trap electrons.

47. The apparatus of claim 45, further comprising a voltage source to provide a bias voltage across the anode and the cathode of the photodetector.

48. The apparatus of claim 45 in which the nanoparticles comprise at least one of zinc oxide (ZnOx), titanium oxide (TiOx), tin oxide (SnOx), zinc sulfide (ZnS), iron sulfide (FeS), iron pyrite (FeS2), Ge, InAs, InSb, $Pb_{1-x}Sn_xTe$, $Hg_{1-x}Cd_xTe$, InAsSb, InNSb, InBiTe, or InTlSb.

* * * * *

UNITED STATES PATENT AND TRADEMARK OFFICE
CERTIFICATE OF CORRECTION

PATENT NO. : 9,685,567 B2  
APPLICATION NO. : 13/946975  
DATED : June 20, 2017  
INVENTOR(S) : Jinsong Huang and Fawen Guo Page 1 of 1

It is certified that error appears in the above-identified patent and that said Letters Patent is hereby corrected as shown below:

On the Title Page

Column 1, "Other Publications," Line 3, item (56) replace "photodector" with -- photodetector --.

Column 2, Line 11, item (56) replace "Photodectectors" with -- Photodetectors --.

Column 2, Line 33, item (56) replace "Carge-Carrier" with -- Charge-Carrier --.

Column 2, Line 49, item (56) replace "Appi." with -- Appl. --.

In the Claims

Column 17, Line 61, Claim 4, replace "thieno[3,2-b']thiophene)" with -- thieno[3,2-b]thiophene) --.

Column 18, Line 27, Claim 8, replace "bis[(ptrichlorosilylpropylphenyl)" with -- bis[(p-trichlorosilylpropylphenyl) --.

Column 20, Line 26, Claim 24, replace "bis[(ptrichlorosilylpropylphenyl)" with -- bis[(p-trichlorosilylpropylphenyl) --.

Column 21, Line 57, Claim 32, after "zinc" and insert -- sulfide --.

Column 21, Line 57, Claim 32, delete "iron pyrite (FeS)" and insert -- iron sulfide (FeS) --.

Column 22, Line 56, Claim 41, replace "bis[(ptrichlorosilylpropylphenyl)" with -- bis[(p-trichlorosilylpropylphenyl) --.

Signed and Sealed this  
Ninth Day of July, 2019

Andrei Iancu  
*Director of the United States Patent and Trademark Office*